(12) United States Patent
Hollingshead

(10) Patent No.: US 9,411,927 B2
(45) Date of Patent: Aug. 9, 2016

(54) FLOAT REMAINING VOLUME IDENTIFICATION

(71) Applicant: The Boeing Company, Chicago, IL (US)

(72) Inventor: Paul Charles Hollingshead, Florissant, MO (US)

(73) Assignee: THE BOEING COMPANY, Chicago, IL (US)

( * ) Notice: Subject to any disclaimer, the term of this patent is extended or adjusted under 35 U.S.C. 154(b) by 664 days.

(21) Appl. No.: 13/647,774

(22) Filed: Oct. 9, 2012

(65) Prior Publication Data

US 2014/0100831 A1 Apr. 10, 2014

(51) Int. Cl.
G06G 7/48 (2006.01)
G06F 17/50 (2006.01)

(52) U.S. Cl.
CPC .................................. *G06F 17/5086* (2013.01)

(58) Field of Classification Search
CPC .................................................... G06F 17/5086
USPC ......................................... 703/7, 1; 702/155
See application file for complete search history.

(56) References Cited

U.S. PATENT DOCUMENTS

| | | | |
|---|---|---|---|
| 4,918,627 A | 4/1990 | Garcia et al. | |
| 6,148,494 A * | 11/2000 | Bauer et al. | 29/407.05 |
| 6,507,806 B1 * | 1/2003 | Tandler | 703/1 |
| 6,963,824 B1 * | 11/2005 | Davidson | G06F 17/50 342/442 |
| 6,978,220 B2 | 12/2005 | Wilson | |
| 6,993,431 B2 | 1/2006 | Hollingshead et al. | |
| 7,119,805 B2 * | 10/2006 | Batori | G06T 19/00 345/419 |
| 7,499,815 B2 * | 3/2009 | Dischinger et al. | 702/55 |
| 7,590,497 B2 * | 9/2009 | Tornquist | G05B 19/4067 345/420 |
| 7,979,236 B2 | 7/2011 | Wilson et al. | |
| 8,126,688 B2 * | 2/2012 | Hollingshead et al. | 703/7 |
| 8,244,507 B2 * | 8/2012 | Hollingshead et al. | 703/7 |
| 8,253,726 B1 * | 8/2012 | DeSimone et al. | 345/419 |
| 8,370,118 B2 * | 2/2013 | Sims, Jr. | G06F 17/50 700/103 |
| 8,423,325 B2 * | 4/2013 | Sims, Jr. | 703/1 |
| 2005/0288890 A1 * | 12/2005 | Hollingshead et al. | 702/155 |
| 2010/0063770 A1 | 3/2010 | Wilson et al. | |
| 2011/0166824 A1 * | 7/2011 | Haisty et al. | 702/157 |

OTHER PUBLICATIONS co\andikjan et al., "A mechanism for validating dimensioning and tolerancing schemes in CAD systems", 2001 Computer-Aided Design 33.10, pp. 721-737.*
Rivest et al., "Analysis of Product Tolerances for Process Plan Validation," Manufacturing Review, American Society of Mechanical Engineers, vol. 7, No. 4, Dec. 1994, pp. 312-331.
Extended EP Search Report, dated Jan. 23, 2014, regarding Application No. EP13187721, 11 pages.

* cited by examiner

*Primary Examiner* — Kamini S Shah
*Assistant Examiner* — Juan Ochoa
(74) *Attorney, Agent, or Firm* — Yee & Associates, P.C.

(57) ABSTRACT

A method and apparatus for identifying a potential movement of a part containing features. First lines are formed by a computer system on a plane extending from a rotation point on the plane to centers of the features in a feature pattern. Second lines are formed by the computer system on the plane extending from the centers of the features in which the second lines are substantially perpendicular to corresponding first lines. Third lines are formed by the computer system extending from ends of the second lines in which the third lines are substantially perpendicular to the plane. Elongate volumes are formed by the computer system extending from the centers of the features to ends of the third lines. An intersection of the elongate volumes is formed by the computer system. The potential movement of the part containing the features is identified using the intersection.

17 Claims, 14 Drawing Sheets

FLOAT REMAINING VOLUME IDENTIFICATION

BACKGROUND INFORMATION

1. Field

The present disclosure relates generally to manufacturing and, in particular, to manufacturing parts. Still more particularly, the present disclosure relates to a method and apparatus for identifying a volume for a feature pattern used for a part.

2. Background

American, Canadian, German, and International Organization for Standardization (ISO) standards may define methods and requirements for specifying multiple levels of feature-related tolerances. However, the manufacturing industry may not have an efficient or effective way of determining whether these requirements are achieved. Furthermore, no means for accurately assessing the effects of computer simulations with respect to feature-related tolerances may be present for features of more than one design size.

In manufacturing products such as aircraft, numerous parts may be assembled and attached to each other to form an aircraft. For example, without limitation, the airframe of an aircraft may involve matching up feature patterns, such as hole patterns, between various mating parts.

In designing these parts and hole patterns, it may be desirable to ensure that when assembled, fasteners can be placed through the holes or pins in one part and those holes and pins may match up with holes in another part. Some variance may be present in the location and size of holes. An acceptable level of variation of the location and size of the holes according to a particular standard may be known as a tolerance. For example, variation between the size of holes and the location of holes may be analyzed to determine whether parts can be properly assembled.

Data from manufactured parts and data from simulations of parts are currently evaluated to identify an amount of float. This float indicates movement that may occur for one or more parts. This movement may be in terms of translation and rotation.

These evaluations may be made with respect to different parameters for the holes. These parameters may include size, location, form, orientation, and other parameters about the holes.

Software may be used to analyze variation with respect to these and other parameters. Currently available software analysis systems, however, only provide an analysis of a hole pattern in two dimensions. In other words, the identification of the float for the movement of a part using a particular hole pattern is only with respect to movement on two dimensions such as a plane. The movement may be translation and rotation on a plane.

Other types of translation in other dimensions other than the two dimensions are not taken into account with currently used software analysis systems for hole patterns. The availability of information only in two dimensions rather than three dimensions may not provide as much information that may be desired for designing hole patterns and assembly processes for parts using the hole patterns. This lack of information may increase the time and effort needed to manufacture an aircraft.

In particular, currently used software analysis systems are designed to provide information about float in which translation may occur on two axes. In other words, the translation occurs on a plane. Further, the currently available software takes into account rotation about one axis. In other words, the rotation is rotation on the plane.

The currently used software analysis systems are unable to provide information in three dimensions with six decrees of freedom with respect to the float. In other words, currently used software analysis systems do not provide information about translation on three axes and do not provide information about rotation on three axes.

This type of potential movement between parts, however, is the actual movement that may occur when parts are assembled. Not having this type of information may result in designs of parts and instructions for operations to assemble parts that may not be as efficient as desired. This inefficiency may increase the time and cost to manufacture a product as the number of parts in a product increases.

For example, manufacturing an aircraft may involve tens of thousands or hundreds of thousands of parts that are put together and connected to each other using fasteners. If the assembly process is not as efficient as desired the amount of time needed to assemble an aircraft may increase greatly. The increases in time results in increased costs and longer than desired manufacturing times for the aircraft.

Further, when parts are more difficult to assemble, more operators, more tools, or both may be needed to position, hold, or position and hold the parts for assembly. With the need for more tools, the expense to acquire and maintain these tools also increases. As a result, manufacturing the aircraft may be more complex, difficult and expensive than desired using currently available software analysis systems for hole patterns.

Therefore, it would be desirable to have a method and apparatus that takes into account at least some of the issues discussed above, as well as other possible issues.

SUMMARY

In one illustrative embodiment, a method for identifying a potential movement of a part containing features is present. First lines are formed by a computer system on a plane extending from a rotation point on the plane to centers of the features in a feature pattern. Second lines are formed by the computer system on the plane extending from the centers of the features in which the second lines are substantially perpendicular to corresponding first lines. Third lines are formed by the computer system extending from ends of the second lines in which the third lines are substantially perpendicular to the plane. Elongate volumes are formed by the computer system extending from the centers of the features to ends of the third lines. An intersection of the elongate volumes is formed by the computer system. The potential movement of the part containing the features is identified using the intersection.

In another illustrative embodiment, a feature analysis system comprises an analyzer in a computer system. The analyzer is configured to form first lines on a plane from a rotation point on the plane to centers of the features in a feature pattern. The analyzer is further configured to form second lines on the plane extending from the centers of the features substantially perpendicular to corresponding first lines. The analyzer is further configured to form third lines substantially perpendicular to the plane from ends of the second lines. The analyzer is further configured to form elongate volumes extending from the centers of the features to ends of the third lines. The analyzer is further configured to identify an intersection of the elongate volumes. The analyzer is further configured to identify a potential movement of a part containing the features using the intersection.

In yet another illustrative embodiment, a computer program product comprises a computer readable storage medium, first program code stored on the computer readable storage medium, second program code stored on the computer readable storage medium, third program code stored on the computer readable storage medium, fourth program code stored on the computer readable storage medium, fifth program code stored on the computer readable storage medium, and sixth program code stored on the computer readable storage medium. The first program code is for forming first lines on a plane from a rotation point on the plane to centers of the features in a feature pattern. The second program code is for forming second lines on the plane extending from the centers of the features substantially perpendicular to corresponding first lines. The third program code is for forming third lines substantially perpendicular to the plane from ends of the second lines. The fourth program code is for forming elongate volumes extending from the centers of the features to ends of the third lines. The fifth program code is for identifying an intersection of the elongate volumes. The sixth program code is for identifying a potential movement of a part containing the features using the intersection.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

Figure 1:
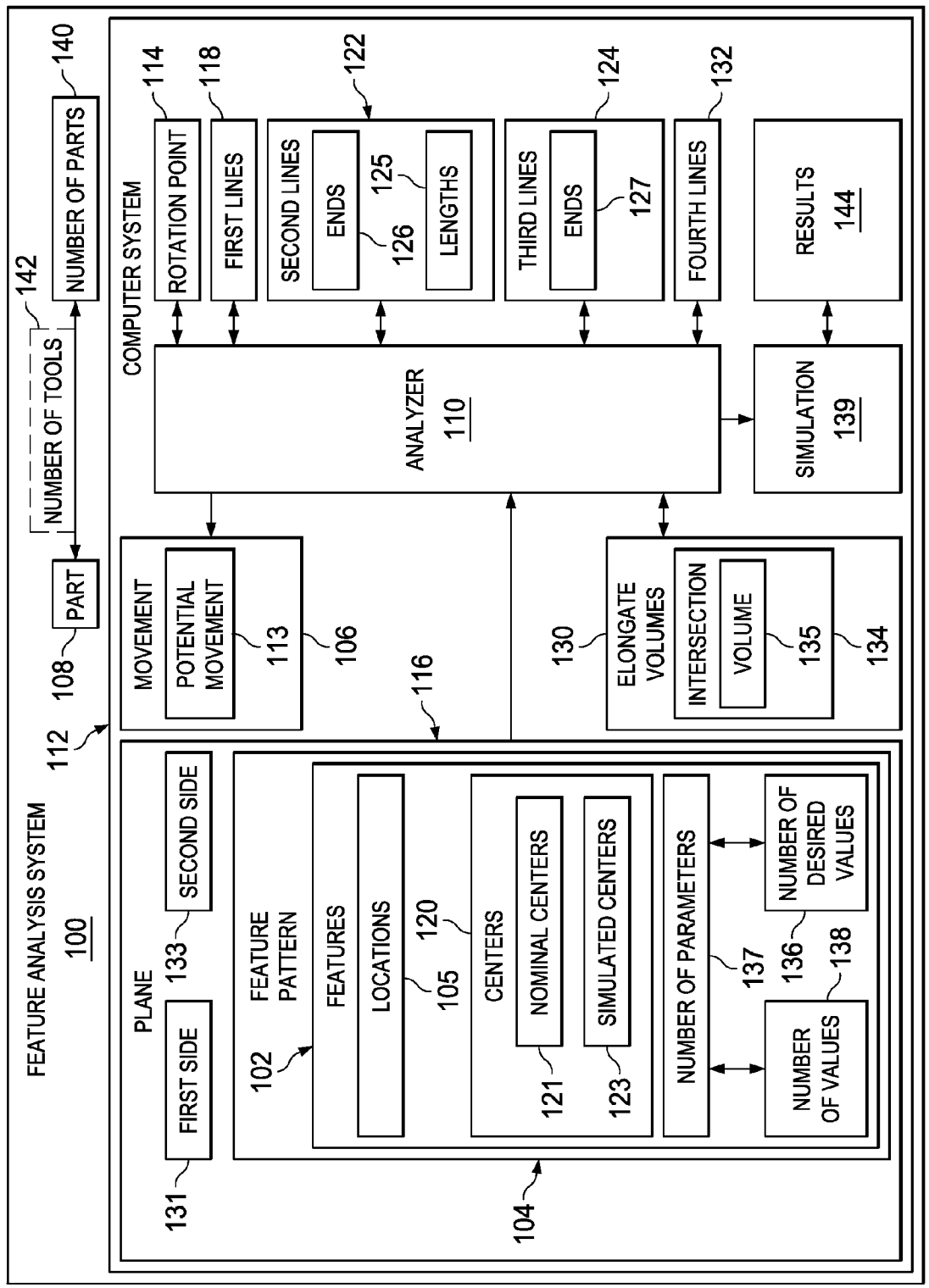
FIG. 1 is an illustration of a block diagram of a feature analysis system in accordance with an illustrative embodiment.

The illustrative embodiments recognize and take into account one or more different considerations. For example, the illustrative embodiments recognize and take into account that a part may move in more than two dimensions. In particular, the potential movement of a part relative to another part may have six degrees freedom. In other words, a part may translate or rotate in multiple dimensions depending on the feature pattern used.

The illustrative embodiments recognize and take into account that being able to consider six degrees of freedom, including potential movement in the form of rotation about three axes in addition to potential movement in the form of translation on three axes may provide a desired amount of information for designing parts, generating instructions to perform operations to assemble parts, as well as other purposes with respect to how potential movement of parts may affect assembling the parts.

The illustrative embodiments recognize and take into account that when features such as holes deviate from desired values for parameters, the part with the values varying from the desired parameters may be more difficult to assemble with respect to another part having the desired parameters. The allowed deviation of values for parameters from the desired values may take the form of tolerances.

The illustrative embodiments also recognize and take into account that currently used analysis techniques only take into account the movement of the part in two dimensions. Thus, other types of movement that may be present in a third dimension are not taken into account by currently available software analysis systems. As a result, evaluating the part in the assembly of the part with other parts may not be as accurate as desired. Further, with less information about the movement that may occur between parts, designs of the parts and the assembly of parts may not be as efficient as desired with the limited amount of information.

The illustrative embodiments recognize and take into account that information about the movement of parts in three dimensions may be useful in evaluating acceptable tolerances from desired parameters for holes. Additionally, when the movement of parts in three dimensions is identified, this information may be useful in identifying assembly processes for the parts. For example, when more information is available, the design of parts may be selected to reduce the number of tools needed to build and maintain assemblies of the parts using the hole patterns.

Further, the illustrative embodiments recognize and take into account that with information about movement of parts in three dimensions, the design of assembly procedures for the parts also may be more efficient. The illustrative embodiments also recognize and take into account that reducing the number of tools needed, reducing the amount of time needed, or reducing both the number of tools and amount of time needed to assemble parts, or both may reduce the cost for parts and reduce the time and difficulty in assembling the parts.

Thus, the illustrative embodiments provide a method and apparatus for identifying potential movement of a part containing features. In one illustrative embodiment, a computer system forms first lines on a plane from a rotation point on the plane to centers of the features in a feature pattern. The computer system also forms second lines on the plane extending from the centers of the features in which the second lines are substantially perpendicular to the corresponding first lines. The computer system forms third lines extending from the ends of the second lines in which the third lines are substantially perpendicular to the plane. Elongate volumes extending from the centers of the features to the ends of the third lines are also formed by the computer system. An intersection of the elongate volumes is identified. The potential movement of a part containing the features is identified using the intersection of the elongate volumes.

With reference now to the figures and, in particular, with reference to FIG. 1, an illustration of a block diagram of a feature analysis system is depicted in accordance with an illustrative embodiment. In this illustrative example, feature analysis system 100 may be used to analyze features 102 in feature pattern 104.

In these illustrative examples, features 102 have locations 105 in feature pattern 104. Locations 105 of features 102 form a pattern for feature pattern 104 in these illustrative examples. A feature in features 102 may be selected from at least one of a hole, a slotted hole, a rectangular slot, and other suitable types of features.

As used herein, the phrase "at least one of," when used with a list of items, means different combinations of one or more of the listed items may be used and only one of each item in the list may be needed. For example, "at least one of item A, item B, and item C" may include, without limitation, item A or item A and item B. This example also may include item A, item B, and item C or item B and item C.

In these illustrative examples, the analysis of features 102 in feature pattern 104 may be used to identify movement 106 of part 108 when part 108 includes feature pattern 104 with features 102.

In this illustrative example, analyzer 110 is configured to analyze feature pattern 104 with features 102. Analyzer 110 may be implemented in software, hardware, or a combination of the two. When software is used, the operations performed by analyzer 110 may be implemented in program code configured to run on a processor unit. When hardware is employed, the hardware may include circuits that operate to perform the operations in analyzer 110.

In these illustrative examples, the hardware may take the form of a circuit system, an integrated circuit, an application specific integrated circuit (ASIC), a programmable logic device, or some other suitable type of hardware configured to perform a number of operations. With a programmable logic device, the device is configured to perform a number of operations. The device may be reconfigured at a later time or may be permanently configured to perform the number of operations. Examples of programmable logic devices include, for example, a programmable logic array, a programmable array logic, a field programmable logic array, a field programmable gate array, and other suitable hardware devices. Additionally, the processes may be implemented in organic components integrated with inorganic components and/or may be comprised entirely of organic components excluding a human being. For example, the processes may be implemented as circuits in organic semiconductors.

In these illustrative examples, analyzer 110 may be implemented in computer system 112. Computer system 112 is comprised of one or more computers. When more than one computer is present in computer system 112, those computers may be in communication with each other via a communications medium such as a network.

In these illustrative examples, analyzer 110 is configured to identify movement 106 for part 108 containing features 102 in feature pattern 104. In these illustrative examples, movement 106 takes the form of potential movement 113. Potential movement 113 is movement of part 108 that may occur when part 108 includes feature pattern 104 with features 102. Potential movement 113 may also be referred to as a float for part 108.

In identifying potential movement 113 for part 108, analyzer 110 in computer system 112 identifies rotation point 114. Rotation point 114 is a point selected on plane 116. Rotation point 114 may be selected anywhere on plane 116.

Thereafter, analyzer 110 in computer system 112 forms first lines 118 on plane 116 from rotation point 114 on plane 116 to features 102. In particular, first lines 118 extend from rotation point 114 to centers 120 of features 102.

In these illustrative examples, centers 120 may be nominal centers 121 or simulated centers 123. Nominal centers 121 may be desired centers for features 102. In other words, the desired centers are in the desired locations. Simulated centers 123 may be centers 120 that may have varied slightly from nominal centers 121.

For example, the coordinates for simulated centers 123 may have deviated from the coordinates for nominal centers 121 for features 102. This deviation may occur due to variations in measurement techniques, manufacturing of the part, or other factors. In some illustrative examples, simulated centers 123 may be nominal centers 121, depending on the particular implementation.

Additionally, analyzer 110 also forms second lines 122 on plane 116 extending from centers 120 of features 102 substantially perpendicular to corresponding ones of first lines 118. In other words, a second line in second lines 122 extends from a center in centers 120 in a direction that is substantially perpendicular to a first line in first lines 118 for a particular feature in features 102.

In these illustrative examples, second lines 122 extend substantially perpendicular from first lines 118, extending from rotation point 114 to centers 120 of features 102, in the same direction as first lines 118. For example, this direction may be clockwise or counterclockwise with respect to first lines 118 extending from rotation point 114.

Second lines 122 have lengths 125. Lengths 125 are proportional to corresponding first lines 118. In other words, a length in lengths 125 for a second line in second lines 122 has a fixed proportion. The proportion is multiplied by the length of the first line in first lines 118 from which the second line in second lines 122 extends.

Analyzer 110 forms third lines 124 substantially perpendicular to plane 116 from ends 126 of second lines 122. In these illustrative examples, third lines 124 extend in a direction that is substantially perpendicular to plane 116. Thereafter, analyzer 110 forms elongate volumes 130 extending from centers 120 of features 102 to ends 127 of third lines 124. In this illustrative example, elongate volumes 130 extending from centers 120 of features 102 to ends 127 of third lines 124 are located on first side 131 of plane 116.

In these illustrative examples, elongate volumes 130 may be formed around fourth lines 132 that extend through centers 120 of features 102 and ends 126 of third lines 124. As depicted, fourth lines 132 may extend centrally through elongate volumes 130.

In addition, elongate volumes 130 also may extend from centers 120 of features 102 in an opposite direction such that elongate volumes 130 also are on second side 133 of plane 116. In other words, elongate volumes 130 may extend around fourth lines 132 on second side 133. The lengths of elongate volumes 130 may be substantially the same on both first side 131 and second side 133 of plane 116.

Analyzer 110 then identifies intersection 134 of elongate volumes 130. In these illustrative examples, intersection 134 may be identified by translating centers 120 on plane 116 such that centers 120 have a common point. In other words, elongate volumes 130 may be moved such that the position of centers 120 from which elongate volumes 130 extend have the same position on plane 116. In particular, elongate volumes 130 may be moved such that the position of nominal centers 121 from which elongate volumes 130 extend have the same position on plane 116 in these illustrative examples.

Intersection 134 takes the form of volume 135 in these illustrative examples. If elongate volumes 130 do not intersect each other, then intersection 134 does not result. If more than one intersection 134 occurs, part 108 cannot be mated with an equivalent part in these illustrative examples.

Intersection 134 represents potential movement 113 of part 108 when part 108 includes features 102 in feature pattern 104. In particular, potential movement 113 is movement in three dimensions. In these illustrative examples, potential movement 113 may include at least one of translation and rotation in three dimensions.

As depicted, volume 135 for intersection 134 may indicate how much part 108 may move relative to another part having features 102 with number of desired values 136 for number of parameters 137. Number of parameters 137 may be, for example, at least one of a location of the center of a hole, a size of the hole, an orientation of the hole, and other suitable parameters. Number of desired values 136 may be one or more values specified in a design for feature pattern 104. Number of desired values 136 may also be referred to as true values for number of parameters 137.

In these illustrative examples, potential movement 113 is movement of part 108 incorporating features 102 with number of values 138 for number of parameters 137. Number of values 138 are one or more values for number of parameters 137 that are present in feature pattern 104 when feature pattern 104 is formed in part 108 physically or in a simulation.

Number of values 138 for number of parameters 137 may vary or be different from number of desired values 136 for number of parameters 137. Number of desired values 136 is one or more values for number of parameters 137 that are present when features 102 are formed as desired.

Number of values 138 may be actual values that are generated during formation of features 102. In these illustrative examples, the variance of number of values 138 from number of desired values 136 may affect intersection 134. In some cases, intersection 134 may not occur if number of values 138 vary from number of desired values 136 by some amount.

With potential movement 113, analyzer 110 may run simulation 139 for part 108 incorporating features 102 in feature pattern 104. Simulation 139 may be performed for assembling part 108 with number of parts 140 using number of tools 142. In this manner, results 144 from simulation 139 may be used to identify operations to assemble part 108 with number of parts 140, number of tools 142 to assemble part 108 with number of parts 140, changes to feature pattern 104, and other suitable operations.

In these illustrative examples, with the identification of potential movement 113 in three dimensions, a reduction in number of tools 142 used to assemble part 108 in number of parts 140 may be reduced. Additionally, instructions for operations to assemble part 108 with number of parts 140 also may be more efficient. A number of human operators used to assemble part 108 with number of parts 140 also may be reduced. These and other efficiencies may occur using analyzer 110 to identify potential movement 113.

As a result, the amount of time and effort needed to assemble part 108 with number of parts 140 may be reduced. Thus, manufacturing an object such as an aircraft that uses part 108 and number of parts 140 may be performed with less expense and more quickly with the use of an illustrative embodiment.

The illustration of feature analysis system 100 in FIG. 1 is not meant to imply physical or architectural limitations to the manner in which a feature analysis system may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, in some illustrative examples, analyzer 110 in feature analysis system 100 may be used to analyze feature pattern 104 on parts that have already been manufactured. In yet other illustrative examples, analyzer 110 may be used to analyze designs for feature pattern 104. In still other illustrative examples, analyzer 110 may be part of a computer-aided design system.

In these illustrative examples, features 102 may have a number of sizes. For example, different features within feature pattern 104 may have different sizes. Additionally, different types of features may be present in features 102 in the feature pattern 104. Further, plane 116 may define a surface of a part which features 102 in feature pattern 104 are located. Of course, in other illustrative examples, part 108 may not have a planar surface that may correspond to plane 116. Part 108 may have a curved shape or other non-planar shape depending on the particular implementation.

With reference now to FIGS. 2-11, illustrations of operations performed to identify potential movement of a part with a hole pattern is depicted in accordance with an illustrative embodiment. The different operations illustrated in these figures may be implemented in figure analysis system 100 using analyzer 110 in FIG. 1.

Figure 2:
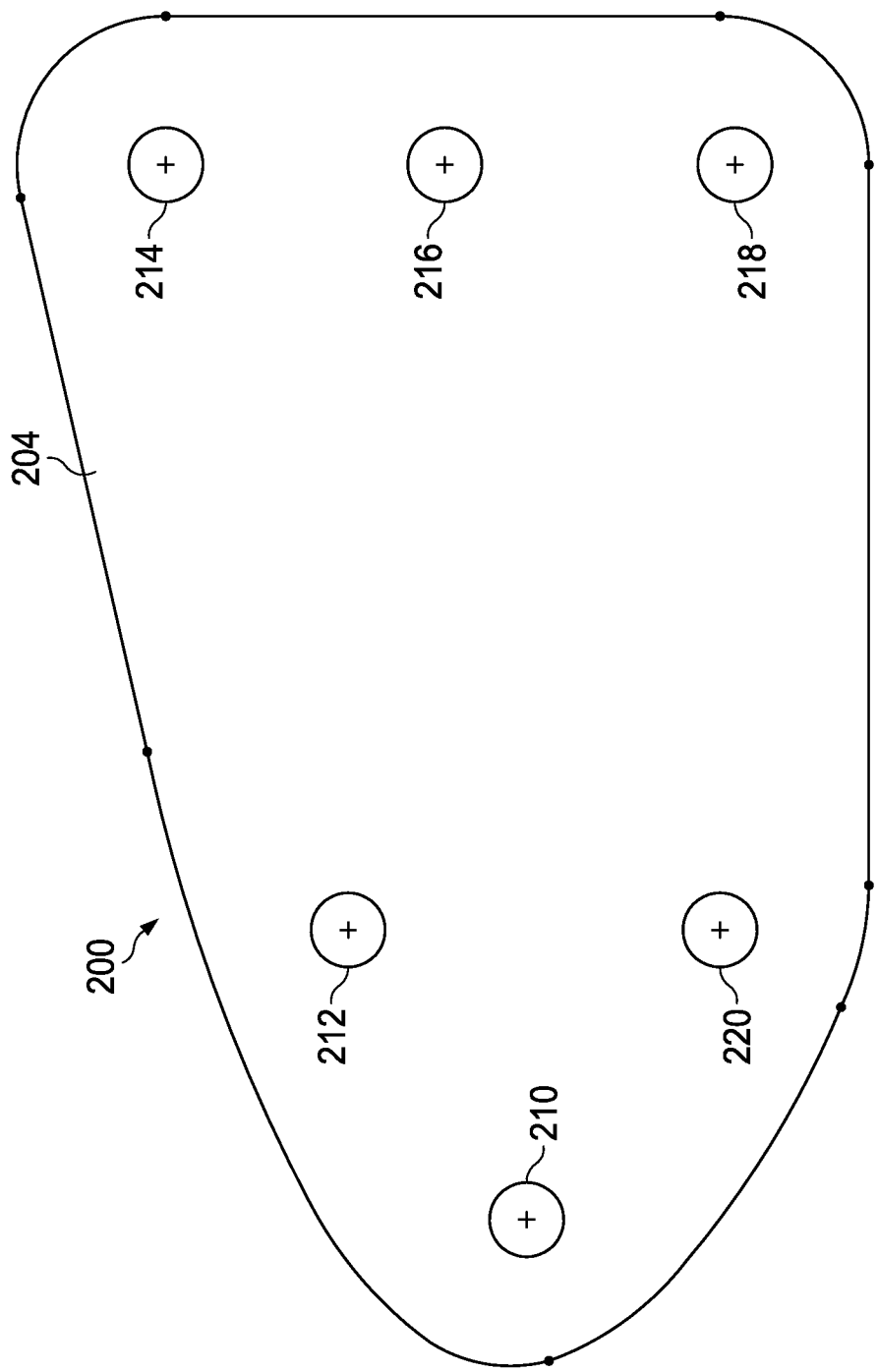
FIG. 2 is an illustration of a hole pattern in accordance with an illustrative embodiment.

Turning now to FIG. 2, an illustration of a hole pattern is depicted in accordance with an illustrative embodiment. In this illustrative example, hole pattern 200 is an example of an implementation for feature pattern 104 in FIG. 1. As depicted, hole pattern 200 is located on plane 204. In this illustrative example, hole pattern 200 includes hole 210, hole 212, hole 214, hole 216, hole 218, and hole 220.

Figure 3:
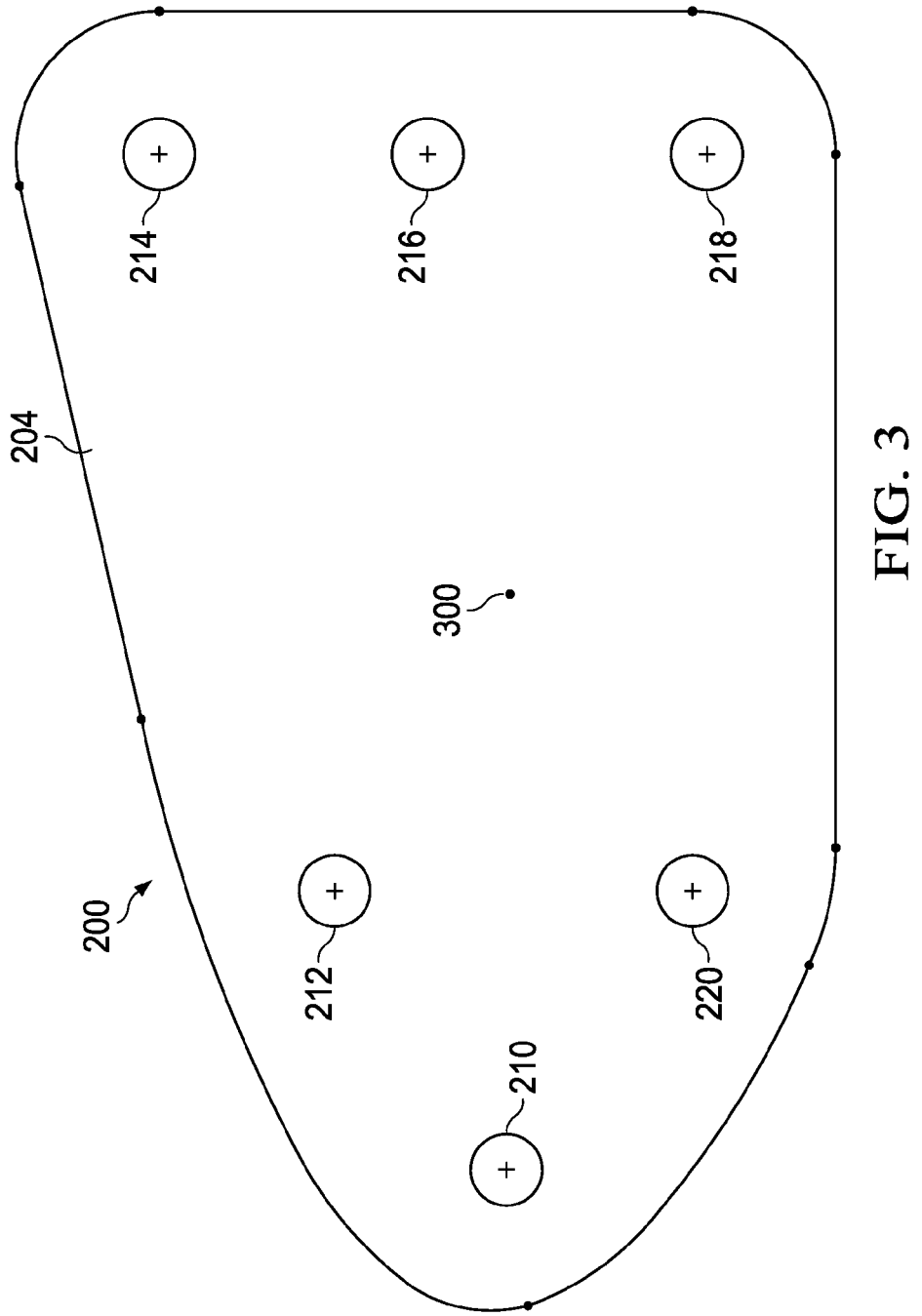
FIG. 3 is an illustration of a rotation point in accordance with an illustrative embodiment.

Turning now to FIG. 3, an illustration of a rotation point is depicted in accordance with an illustrative embodiment. In this illustrative example, rotation point 300 is selected on plane 204. Rotation point 300 is shown as being substantially central to locations for the holes. Of course, in other illustrative examples, rotation point 300 may be located in other locations other than the one depicted.

Figure 4:
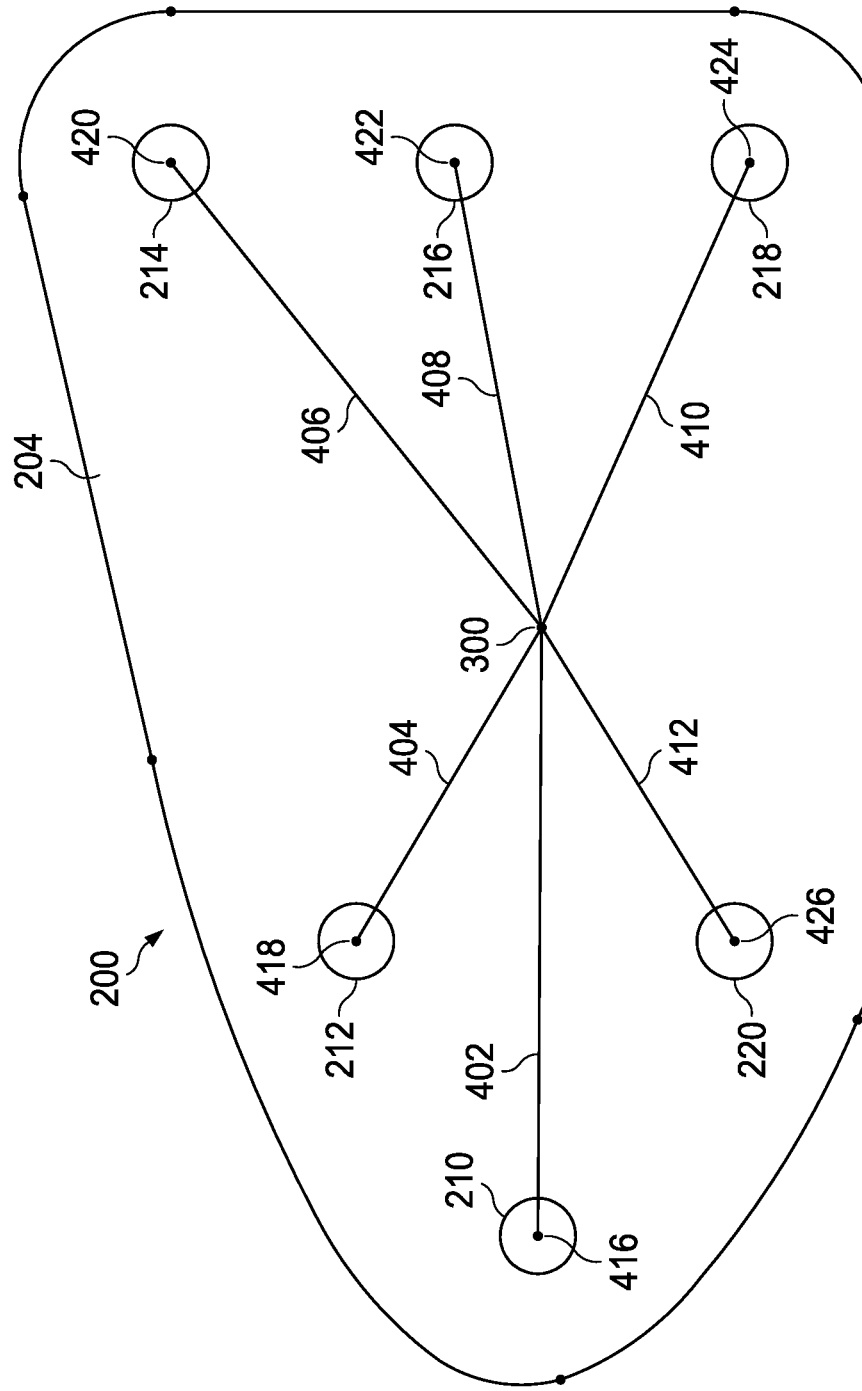
FIG. 4 is an illustration of first lines in accordance with an illustrative embodiment.

With reference now to FIG. 4, an illustration of first lines is depicted in accordance with an illustrative embodiment. In this depicted example, first lines are formed as extending from rotation point 300 to the centers of holes in hole pattern 200. These centers are an example of one implementation for centers 120 in FIG. 1. More particularly, the centers may be simulated centers 123 in FIG. 1.

As depicted, the first lines include first line 402, first line 404, first line 406, first line 408, first line 410, and first line 412. In this illustrative example, first line 402 extends from rotation point 300 to hole 210. First line 404 extends from rotation point 300 to hole 212. First line 406 extends from rotation point 300 to hole 214. First line 408 extends from rotation point 300 to hole 216. First line 410 extends from rotation point 300 to hole 218, and first line 412 extends from rotation point 300 to hole 220.

In particular, the first lines extend from rotation point 300 to the centers of the holes in hole pattern 200. In this example, first line 402 extends to center 416 of hole 210, first line 404 extends to center 418 of hole 212, first line 406 extends to center 420 of hole 214, first line 408 extends to center 422 of hole 216, first line 410 extends to center 424 of hole 218, and first line 412 extends to center 426 of hole 220.

The centers for the holes are the centers using the number of values identified for the holes. In other words, the values for the location of the centers may not be nominal centers 121 in FIG. 1. Nominal centers 121 may be the desired values for the centers and may be in a different location than those shown for the centers in this illustrative example.

Figure 5:
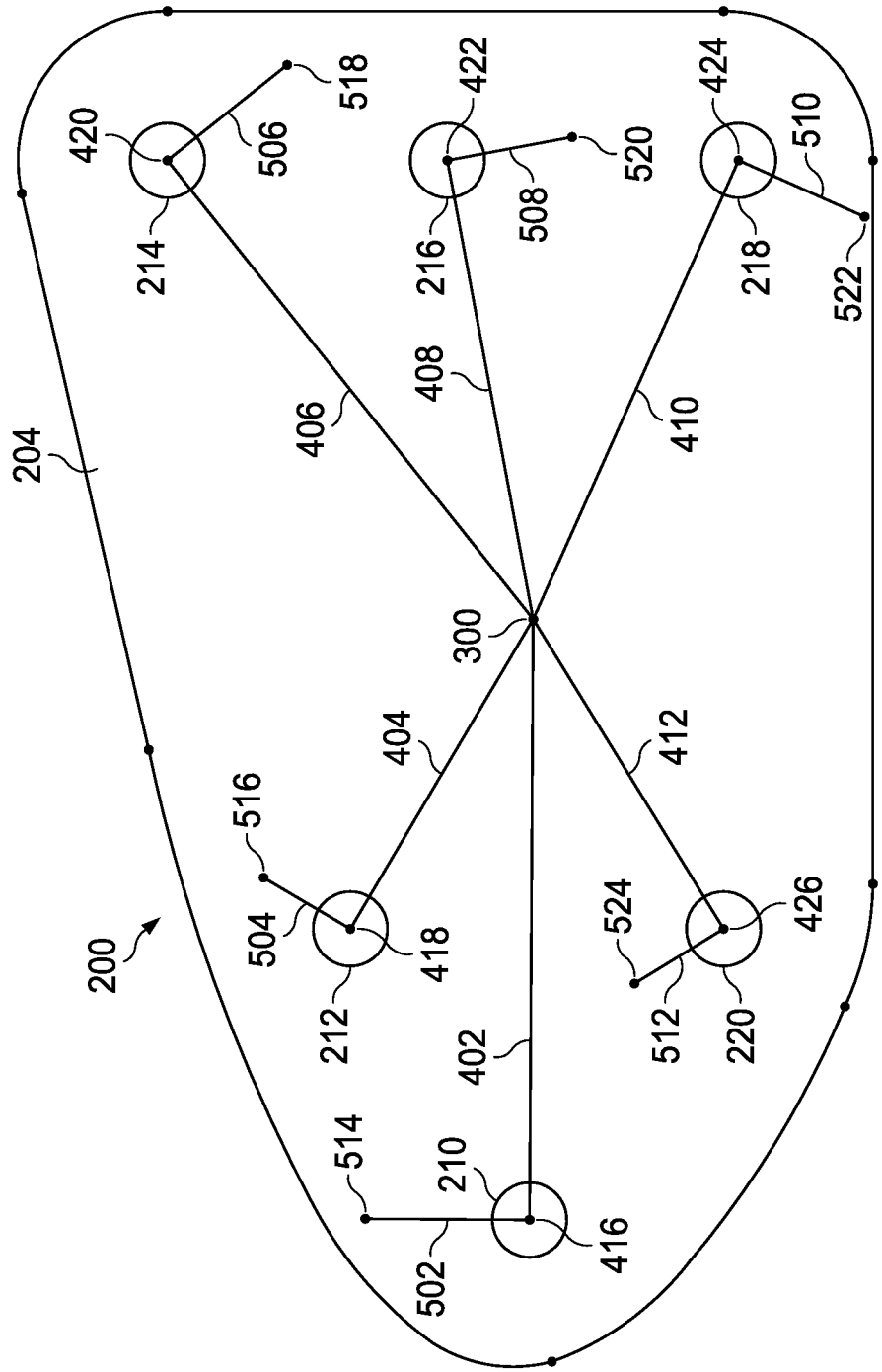
FIG. 5 is an illustration of second lines formed substantially perpendicular to first lines in accordance with an illustrative embodiment.

In FIG. 5, an illustration of second lines formed substantially perpendicular to first lines is depicted in accordance with an illustrative embodiment. In this illustrative example, the second lines extend in a direction substantially perpendicular to the first lines.

In this illustrative example, second line 502 is substantially perpendicular to first line 402. Further, second line 504 is substantially perpendicular to first line 404, second line 506 is substantially perpendicular to first line 406, second line 508 is substantially perpendicular to first line 408, second line 510 is substantially perpendicular to first line 410, and second line 512 is substantially perpendicular to first line 412.

In these illustrative examples, the second lines are all in the same direction with respect to the first lines. As depicted, the second lines extend in a direction that is clockwise relative to rotation point 300 in the first lines. Of course, in other illustrative examples, the second lines may extend in the opposite direction, counterclockwise, relative to rotation point 300 in the first lines.

In these illustrative examples, the second lines all have lengths that are proportional to the first lines. In other words, the same proportion is used to identify the length for each of the second lines. As a result, the second lines may have different lengths depending on the lengths of the corresponding first lines.

As depicted, second line 502 has end 514, second line 504 has end 516, second line 506 has end 518, second line 508 has end 520, second line 510 has end 522, and second line 512 has end 524.

Figure 6:
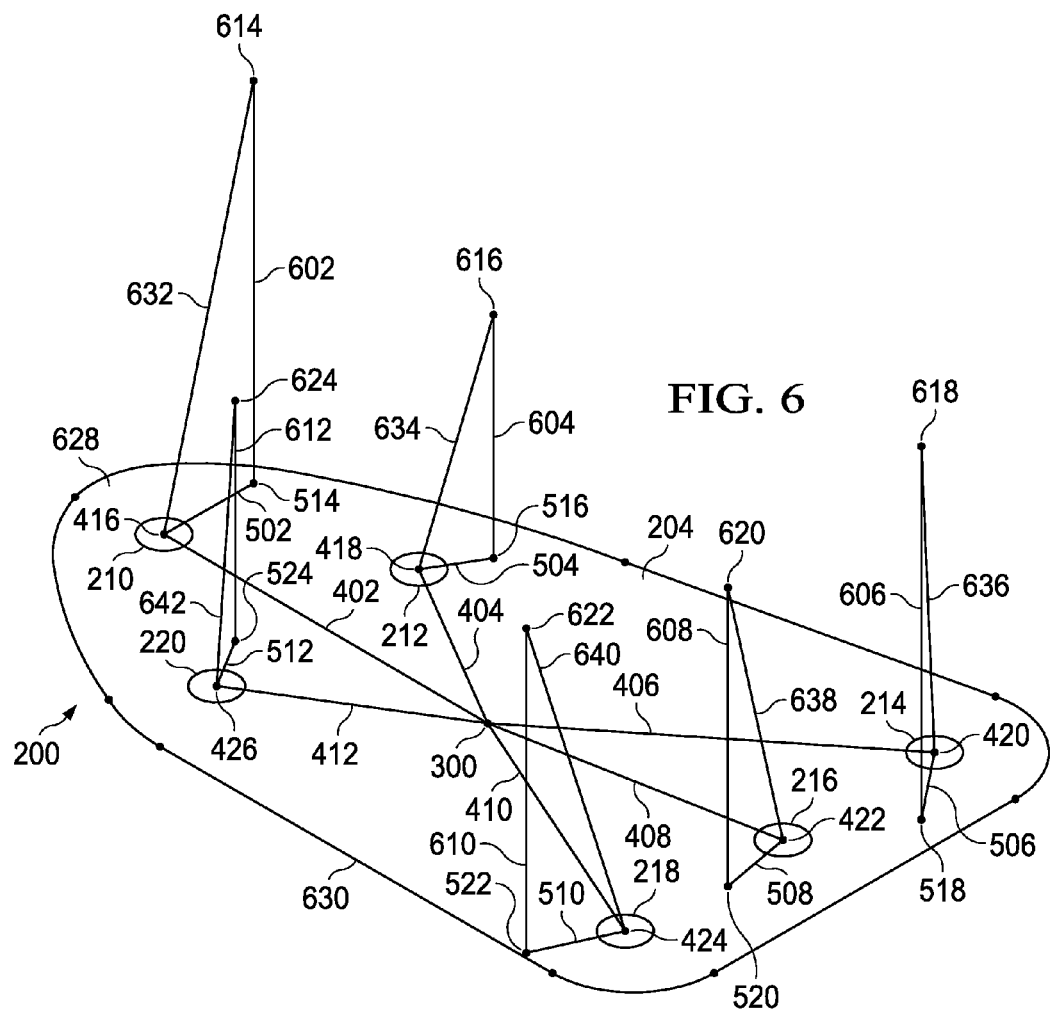
FIG. 6 is an illustration of third lines formed from the ends of the second lines in accordance with an illustrative embodiment.

With reference now to FIG. 6, an illustration of third lines formed from the ends of the second lines is depicted in accordance with an illustrative embodiment. In this depicted example, the third lines extend from the ends of the second lines. In this illustrative example, third line 602 extends from end 514 of second line 502, third line 604 extends from end 516 of second line 504, third line 606 extends from end 518 of second line 506, third line 608 extends from end 520 of second line 508, third line 610 extends from end 522 of second line 510, and third line 612 extends from end 524 of second line 512.

The third lines have ends in these illustrative examples. As depicted, third line 602 has end 614, third line 604 has end 616, third line 606 has end 618, third line 608 has end 620, third line 610 has end 622, and third line 612 has end 624.

As can be seen, each of these lines extends substantially perpendicular to plane 204 from the ends of the second lines. In this illustrative example, the third lines are shown to extend from first side 628 of plane 204 and not from second side 630 of plane 204. Of course, these third lines also may extend in the other direction of plane 204. As depicted, the third lines have the same length. The length of the third lines may determine the scale of the volumes formed in FIG. 7 below.

In these illustrative examples, fourth lines may be formed using the centers of the holes and the ends of the third lines. In particular, fourth line 632 extends from center 416 of hole 210 to end 614 of third line 602. Fourth line 634 extends from center 418 of hole 212 to end 616 of third line 604. Fourth line 636 extends from center 420 of hole 214 to end 618 of third line 606. Fourth line 638 extends from center 422 of hole 216 to end 620 of third line 608. Fourth line 640 extends from center 424 of hole 218 to end 622 of third line 610, and fourth line 642 extends from center 426 of hole 220 to end 624 of third line 612.

Figure 7:
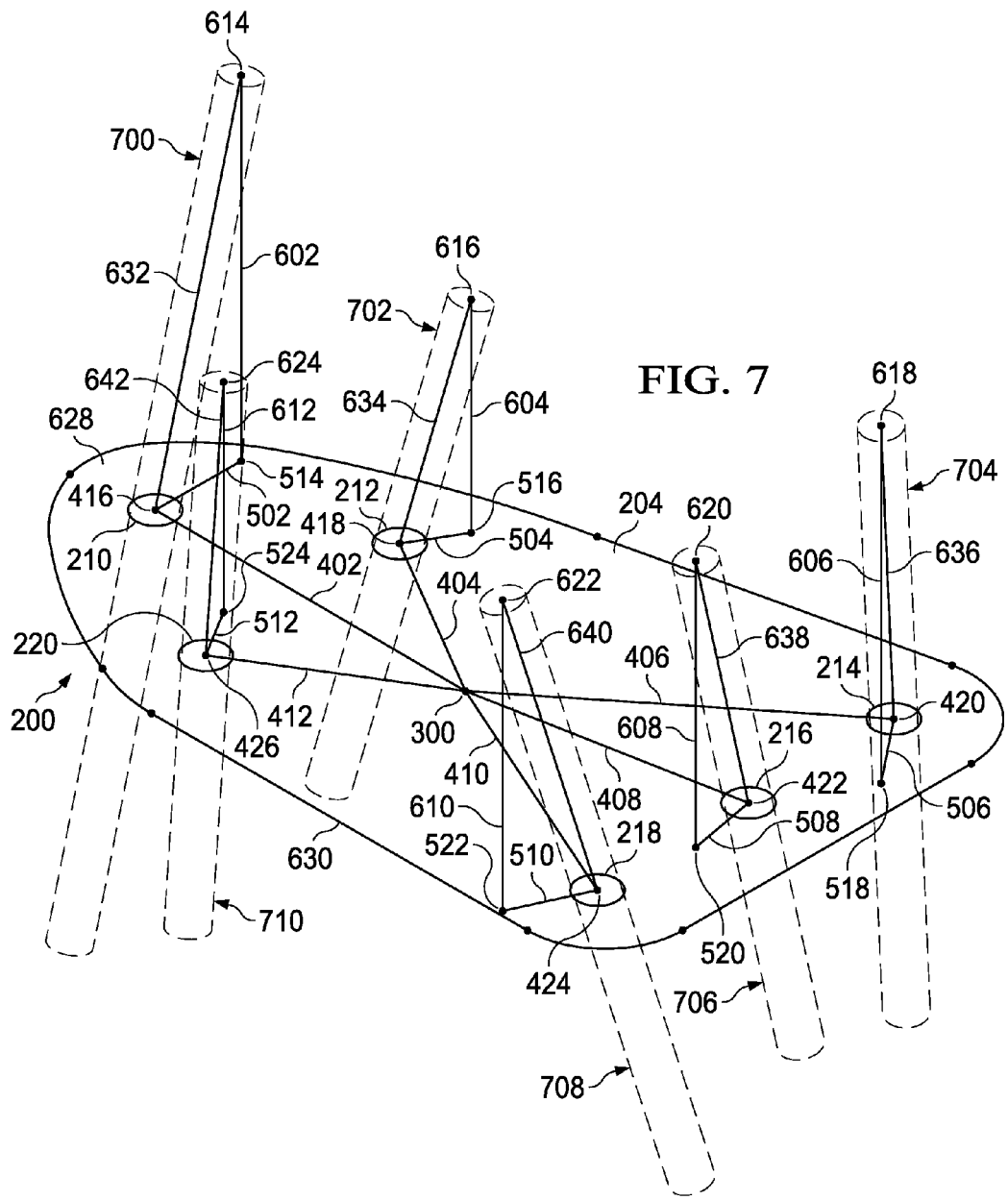
FIG. 7 is an illustration of volumes formed using third lines in accordance with an illustrative embodiment.

Turning now to FIG. 7, an illustration of volumes formed using third lines is depicted in accordance with an illustrative embodiment. In this depicted example, cylinders are formed extending from the centers of the holes to the ends of the third lines on first side 628 of plane 204.

For example, cylinder 700 extends from center 416 of hole 210 to end 614 of third line 602. Cylinder 702 extends from center 418 of hole 212 to end 616 of third line 604. Cylinder 704 extends from center 420 of hole 214 to end 618 of third line 606. Cylinder 706 extends from center 422 of hole 216 to end 620 of third line 608. Cylinder 708 extends from center 424 of hole 218 to end 622 of third line 610. Cylinder 710 extends from center 426 of hole 220 to end 624 of third line 612.

In this illustrative example, the cylinders also extend from the centers of the holes on second side 630 of plane 204. The length of the cylinders on second side 630 is the same as on first side 628.

Figure 8:
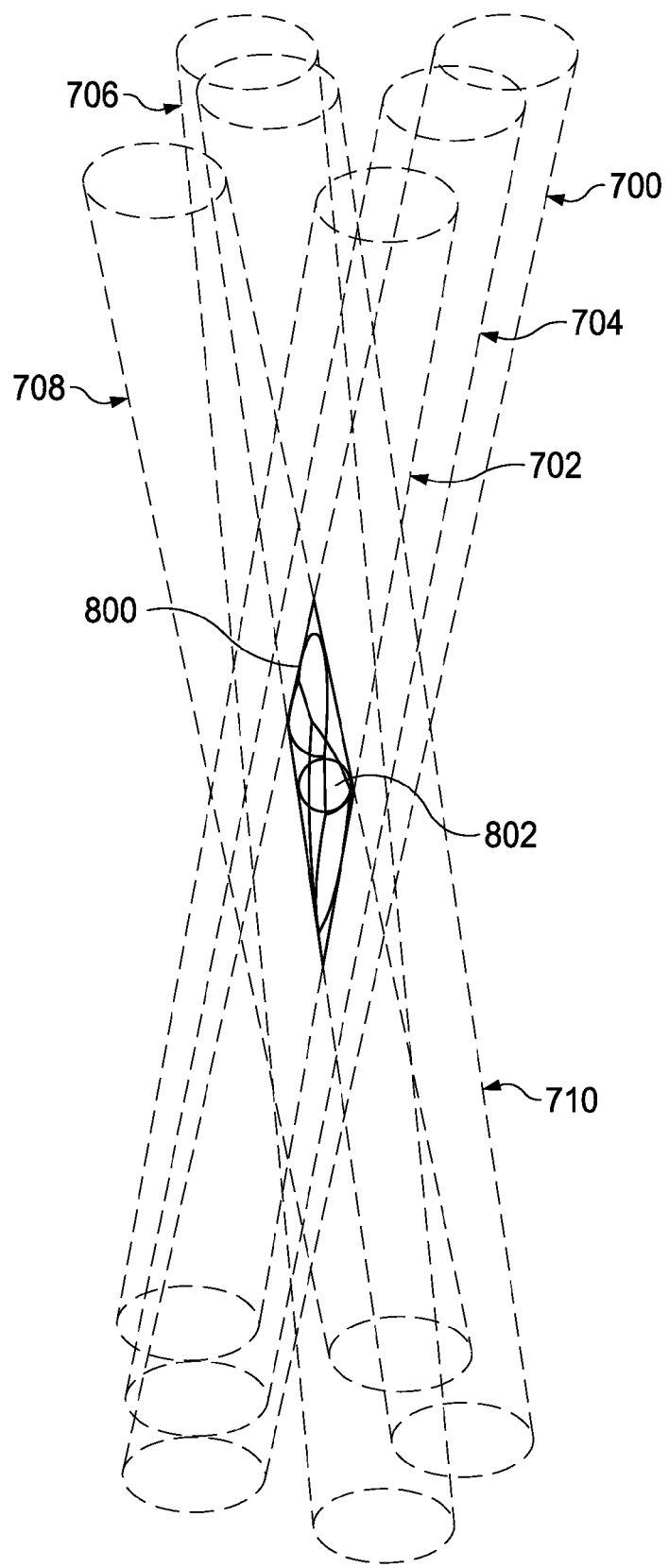
FIG. 8 is an illustration of an intersection of cylinders in accordance with an illustrative embodiment.

Turning now to FIG. 8, an illustration of an intersection of cylinders is depicted in accordance with an illustrative embodiment. In this depicted example, the cylinders illustrated in FIG. 7 are translated such that nominal centers 121 in FIG. 1 of the circles that generate the cylinders have the same location on plane 204 in FIG. 2. In this illustrative example, the location is that of rotation point 300 in FIG. 3. Of course, the location may be any point on plane 204 or even on another plane depending on the particular implementation.

As depicted, these cylinders have intersection 800. Intersection 800 takes the form of volume 802. Volume 802 for intersection 800 identifies the potential movement of a part having hole pattern 200 in FIG. 3.

Figure 9:
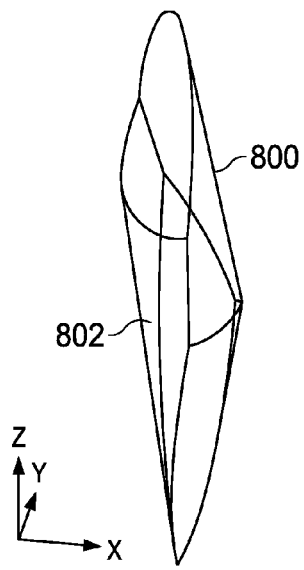
FIG. 9 is an illustration of an intersection in accordance with an illustrative embodiment.

With reference now to FIG. 9, an illustration of an intersection is depicted in accordance with an illustrative embodiment. In this illustrative example, only intersection 800 is shown. Intersection 800 defines potential movement between two parts.

One part includes a number of values for parameters in hole pattern 200. The other part includes desired values for hole pattern 200. In some illustrative examples, the number of values for parameters in hole pattern 200 may not be the same as the desired values for parameters in hole pattern 200.

In this illustrative example, intersection 800 defines potential movement for two translations and one rotation of a part using hole pattern 200. A point within intersection 800 may be selected to provide values for the translations and rotation between two parts that are to be connected to each other. A point outside of intersection 800 may be a position that may not be reached without interference between a part in the two parts and a fastener.

In these illustrative examples, a plane on the x-axis and y-axis with z=0 is similar to what currently available software analysis systems can identify for the float of holes in two dimensions on a plane. In contrast, analyzer 110 in FIG. 1 is capable of generating intersection 800 that is in three dimensions rather than a single two-dimensional plane. In this manner, an identification of rotation and translation may be made in three dimensions instead of two.

Figure 10:
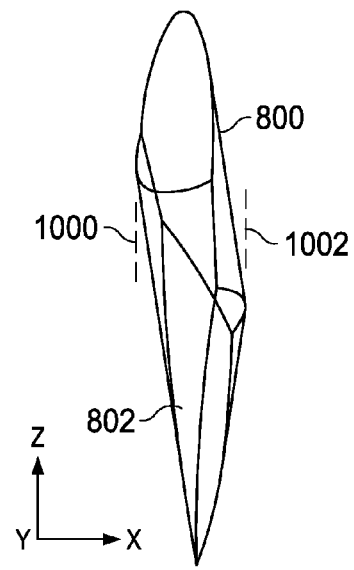
FIG. 10 is an illustration of an intersection seen on a plane in accordance with an illustrative embodiment.

With reference now to FIG. 10, an illustration of an intersection seen on a plane is depicted in accordance with an illustrative embodiment. In this illustrative example, intersection 800 is seen in the view of a plane defined by a z-axis and an x-axis. Line 1000 and line 1002 identify a range of x values for volume 802 in intersection 800. Volume 802 may represent values for x-translation, y-translation, and rotation about the z-axis. In other words, volume 802 may represent the possible values for the translation and rotation in future simulation steps. Values within the range of x values may be used to identify an x value for use in the simulation.

Figure 11:
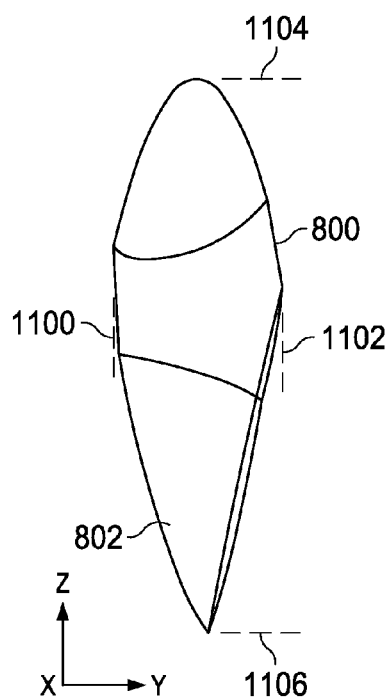
FIG. 11 is an illustration of an intersection seen on a plane in accordance with an illustrative embodiment.

With reference now to FIG. 11, an illustration of an intersection seen on a plane is depicted in accordance with an illustrative embodiment. In this illustrative example, intersection 800 is seen in the view of a plane defined by a z-axis and a y-axis.

As depicted, line 1100 and line 1102 identify a range of y values for volume 802 in intersection 800. Line 1104 and line 1106 represent a range of z values for volume 802 in intersection 800. This range of y values and z values may be used to identify a y value and a z value for use in later simulation steps.

Figure 12:
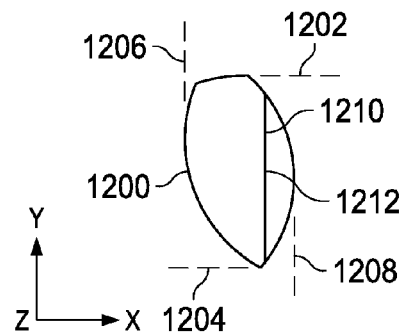
FIG. 12 is an illustration of a planar section from the volume of an intersection in accordance with an illustrative embodiment.

With reference now to FIG. 12, an illustration of a planar section from the volume of an intersection is depicted in accordance with an illustrative embodiment. In this depicted example, planar section 1200 is obtained from selecting a value for the z-axis for volume 802 in intersection 800 in FIG. 8.

In this example, line 1202 and line 1204 indicate the extent of values along the y-axis while line 1206 and line 1208 indicate the extent of values along the x-axis. With planar section 1200, line 1210 may be selected within planar section 1200. Line 1210 represents a selected x value within planar section 1200 of volume 802.

In these illustrative examples, point 1212 is also depicted. Point 1212 represents a y value that has been chosen for simulation.

The illustration of intersection 800 and volume 802 in FIGS. 8-12 is not meant to limit the manner in which a simulation may be configured. For example, although the illustrative embodiments are described by selecting values in order of a z value, an x value, and a y value in FIGS. 9-12, values may be selected in any order. In other words, any one of these values may be initially selected based on volume 802 and used in future simulation steps to determine the other two values. Once all three coordinates have been selected for a point within volume 802, simulated movement for this part may be determined.

The illustration of the holes in hole pattern 200 in FIGS. 2-12 are not meant to limit the manner in which different illustrative embodiments may be implemented. The illustration of hole pattern 200 is only meant as one illustrative example of the hole pattern in which an analysis may be made using an illustrative embodiment.

For example, other numbers of holes may be used instead of six holes. As an example, in other illustrative examples, a hole pattern may include two holes, five holes, eleven holes, or some other number of holes. Further, the holes may have different sizes rather than holes of the same size as illustrated in hole pattern 200.

In still other illustrative examples, other types of features may be used in which the features may be of the same type or different types. For example, rectangular slots may be used in addition to the circular holes or in place of the circular holes.

In this manner, the values for a number of parameters selected within the range of intersection 800 may be driven by Gaussian distribution, uniform distribution, or some other suitable type of distribution. Further, by selecting values within intersection 800 on the x-axis, y-axis, and z-axis, a more accurate simulation of potential movement of one part relative to another part may be identified.

Figure 13:
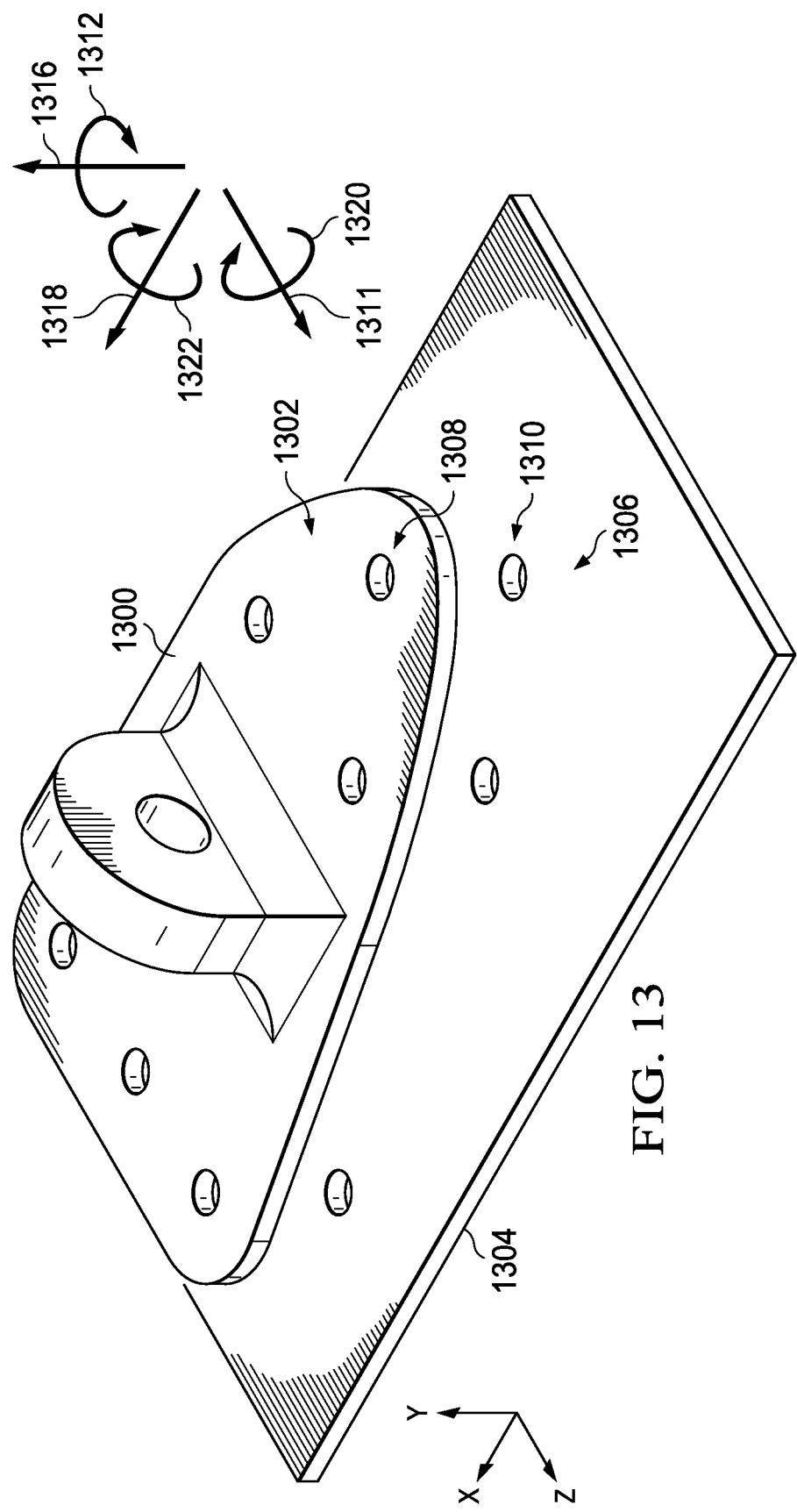
FIG. 13 is an illustration of parts with a hole pattern in accordance with an illustrative embodiment.

With reference now to FIG. 13, an illustration of parts with a hole pattern is depicted in accordance with an illustrative embodiment. In this illustrative example, part 1300 has hole pattern 1302 and part 1304 has hole pattern 1306. Hole pattern 1302 and hole pattern 1306 are examples of an implementation for feature pattern 104 shown in block form in FIG. 1. In particular, hole pattern 1302 and hole pattern 1306 may be based on hole pattern 200 in FIG. 2.

In this illustrative example, the display of part 1300 and part 1304 is a display from a simulation of part 1300 and part 1304 using analyzer 110 in FIG. 1. Holes 1308 in hole pattern 1302 may have values for the location of the centers of holes 1308. Holes 1310 in hole pattern 1306 may have desired values for the location of the centers of holes 1310. In other words, although hole pattern 1302 and hole pattern 1306 are the same hole pattern, the values for different parameters such as the simulated locations of the centers of these hole patterns and simulated hole sizes may be different between the hole patterns.

In this illustrative example, part 1300 may move through translation in the direction of z-axis 1311, x-axis 1318, and y-axis 1316. Further, along these different axes, rotation may occur about y-axis 1316, z-axis 1311, and x-axis 1318 as indicated by arrow 1312, arrow 1320, and arrow 1322, respectively in these illustrative examples. As depicted, part 1300 has six degrees of freedom relative to part 1304.

Simulations may be performed by placing fasteners or pins through holes 1308 in part 1300 and holes 1310 in part 1304. These simulations with respect to potential movement may be performed using analyzer 110 in FIG. 1. The amount of potential movement may vary as different values for holes 1308 in hole pattern 1302 for part 1300 are varied relative to the desired values for holes 1310 for hole pattern 1306 for part 1304. Additionally, other values other than desired values also may be used for holes 1310 in hole pattern 1306 depending on the particular implementation.

Figure 14:
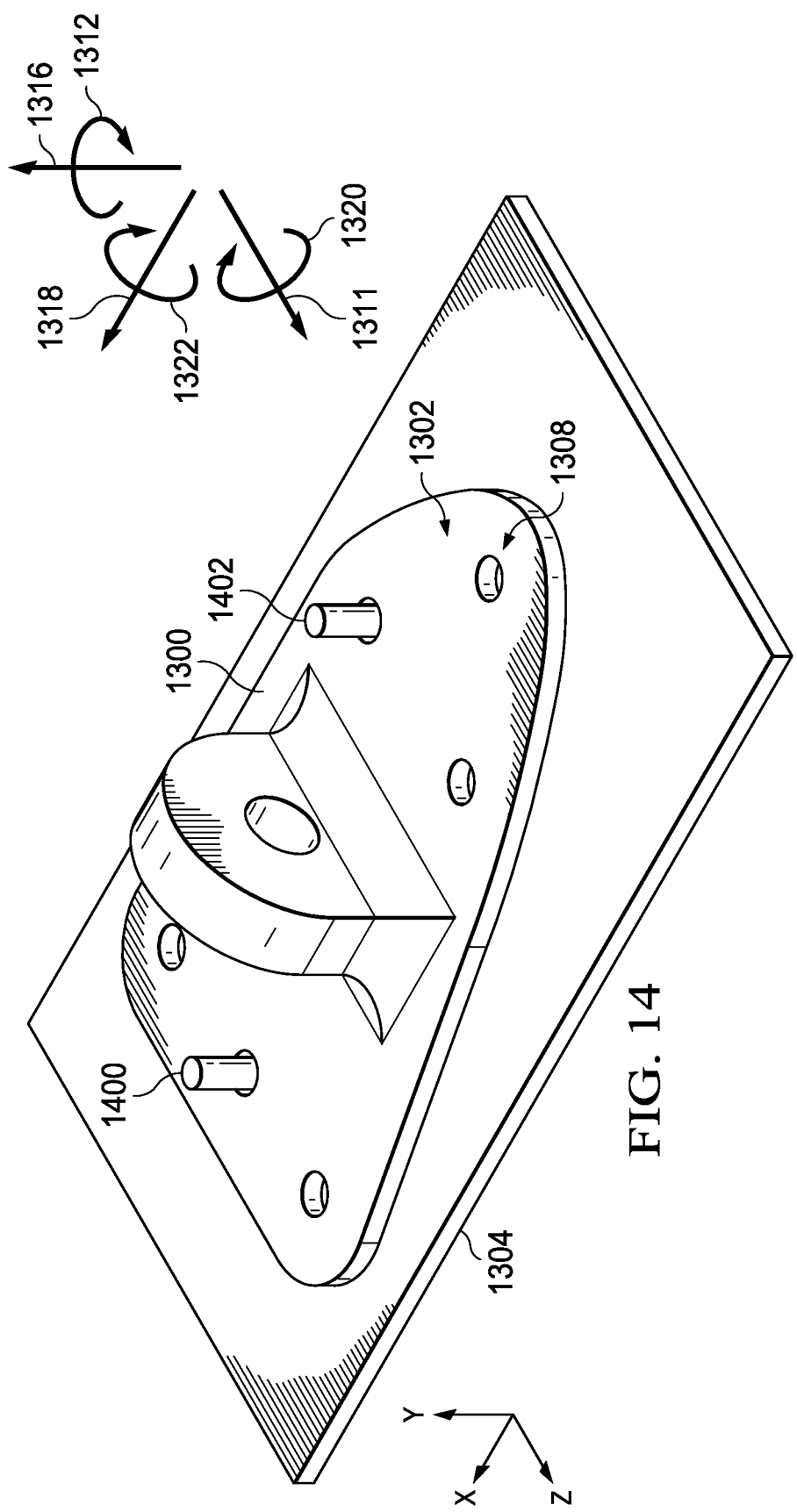
FIG. 14 is an illustration of parts positioned relative to each other with pins in accordance with an illustrative embodiment.

Turning now to FIG. 14, an illustration of parts positioned relative to each other with pins is depicted in accordance with an illustrative embodiment. In this example, part 1300 has been positioned relative to part 1304 such that hole pattern 1302 is substantially aligned with hole pattern 1306 (not shown).

In this example, pin 1400 and pin 1402 have been placed into holes 1308 and holes 1310 (not shown). With the use of an intersection identified by analyzer 110 in FIG. 1, a more accurate simulation of the amount of potential movement that may be present between part 1300 and part 1304 in three dimensions may be made. In this manner, a more accurate evaluation of the ease of assembling part 1300 with part 1304 may be made.

Further, with this more accurate simulation of the potential movement of these parts, a more accurate identification as to what tools may be needed to assemble the parts may be made in addition to identifying operations to be performed in assembling the parts. For example, a determination may be made that having the actual values for parameters, such as the locations for the centers of holes 1308 and holes 1310, selected as being closer to the desired values may increase the ease in assembling part 1300 and part 1304. Further, this tighter tolerance between the values for the parameters and the desired values may reduce the assembly time, the number of tools, the number of operators, and other resources needed to assemble part 1300 and part 1304.

The illustration of the simulation of part 1300 and part 1304 in FIG. 13 and FIG. 14 is not meant to limit the manner which other simulations may be performed. For example, other types of parts may be simulated in other illustrative examples other than part 1300 and part 1304. Further, other numbers of parts also may be used. In some illustrative examples, the simulation may involve three, four, or some other number of parts having a hole pattern. In still other illustrative examples, other types of features may be simulated other than holes.

Figure 15:
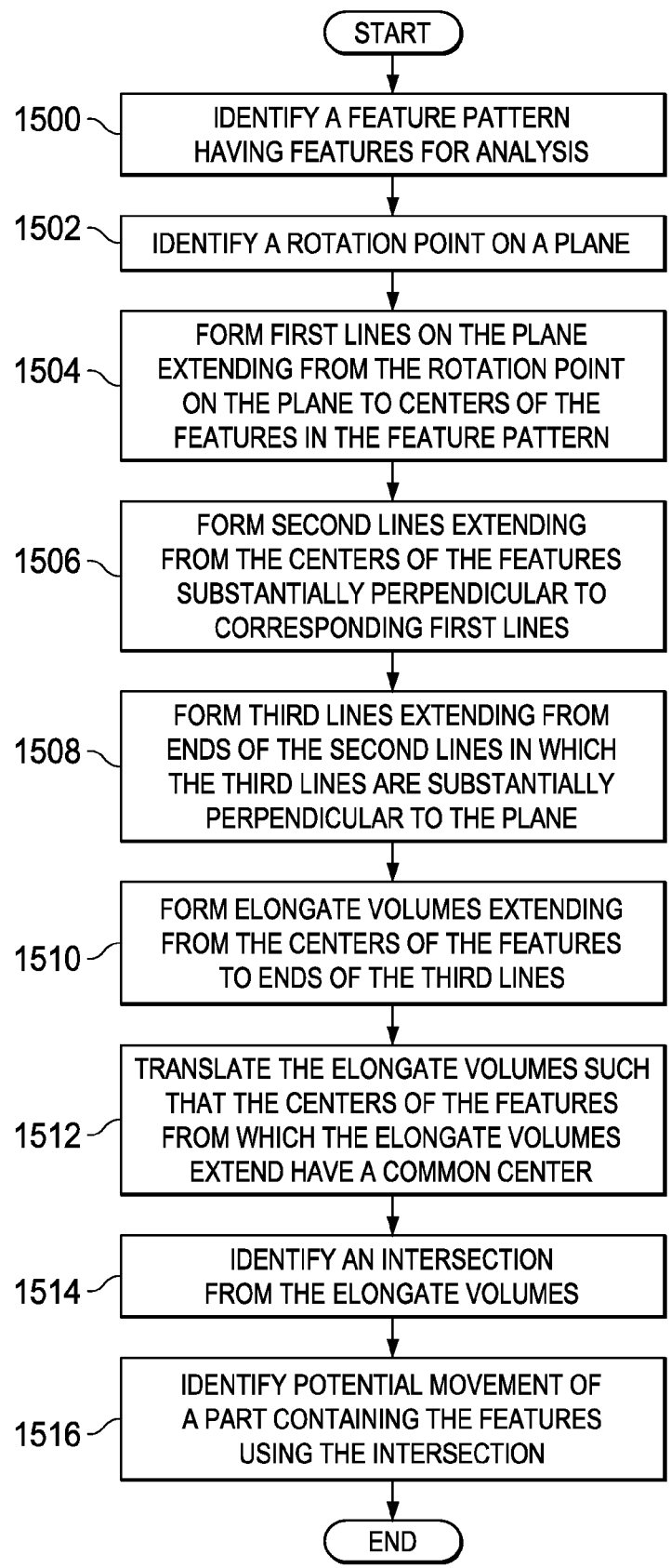
FIG. 15 is an illustration of a flowchart of a process for identifying potential movement of a part containing features in accordance with an illustrative embodiment.

With reference now to FIG. 15, an illustration of a flowchart of a process for identifying potential movement of a part containing features is depicted in accordance with an illustrative embodiment. The process illustrated in FIG. 15 may be implemented using analyzer 110 in FIG. 1. In particular, this process may be implemented to analyze feature pattern 104 with features 102 for part 108 in FIG. 1.

The process begins by identifying a feature pattern having features for analysis (operation 1500). In these illustrative examples, the features on the feature pattern are located on a plane. Of course, these features may be of the same type or different type and may have different parameters between different features of the same or different type. For example, if the features include holes, the holes may have different diameters. In still other illustrative examples, the holes may have centers with locations that are the same or vary from a desired location for the centers of the holes.

A rotation point is identified on a plane (operation 1502). This rotation point may be located anywhere with respect to the features. In one illustrative example, the rotation point may be located centrally with respect to the features on the plane.

The process then forms first lines on the plane extending from the rotation point on the plane to centers of the features in the feature pattern (operation 1504). The process then forms second lines extending from the centers of the features substantially perpendicular to corresponding first lines (operation 1506). The second lines have lengths that are based on a proportion of the first lines. The proportion used for each first line in the first lines is the same.

As a result, the second lines may have different lengths depending on the lengths of the first lines. In other words, the second lines have lengths that are proportional to the corresponding first lines.

In these illustrative examples, the lengths of the first lines may be chosen based on clarity of the illustration. As the proportion increases, the cylinders appear to tilt and separate more clearly in the illustration. With a smaller proportion, the images may not appear as clear when displayed to the operator. In other words, the degree of tilt may not be as pronounced with a smaller proportion and therefore, the depiction of an intersection with a volume may be more cluttered or confusing to the operator.

The process then forms third lines extending from ends of the second lines in which the third lines are substantially perpendicular to the plane (operation 1508). The third lines all have the same length in this illustrative example. The third lines all have the same length to show a complete simulation for the potential of an intersection along the length of the elongate volumes. In other words, the cylinders may be tall enough to show any place where the cylinders intersect with each other. This chosen length sets the scale for converting the vertical coordinate to a rotation angle.

Next, the process forms elongate volumes extending from the centers of the features to ends of the third lines (operation 1510). The shape of the elongate volumes depends on the shape of the feature. For example, if the feature is a hole that is circular, the elongate volume is a cylinder. If the feature is a rectangle, the elongate volume may take the form of a cuboid. In other words, each elongate volume in the elongate volumes has a cross section based on a shape of a corresponding feature in the features.

The process then translates the elongate volumes such that the centers of the features from which the elongate volumes extend have a common center (operation 1512). The process then identifies an intersection from the elongate volumes (operation 1514). The intersection is a volume from which potential movement of a part containing the features may be identified.

The process then identifies potential movement of a part containing the features using the intersection (operation 1516) with the process terminating thereafter. This potential movement may be potential movement of a part containing the features relative to another part that has features in which the parameters for the features have desired values. In other words, this operation may be used to identify an amount of the potential movement of a first part in which the features have a number of values for a number of parameters to a second part in which the features have a number of desired values for the number of parameters relative to each other using the intersection.

Operation 1516 may be performed by performing simulation of a part having features relative to another part having the features using the intersection. In these illustrative examples, the size of the intersection may indicate an ease of assembly of parts using the features.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent a module, a segment, a function, and/or a portion of an operation or step. For example, one or more of the blocks may be implemented as program code, in hardware, or a combination of the program code and hardware. When implemented in hardware, the hardware may, for example, take the form of integrated circuits that are manufactured or configured to perform one or more operations in the flowcharts or block diagrams. In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

Figure 16:
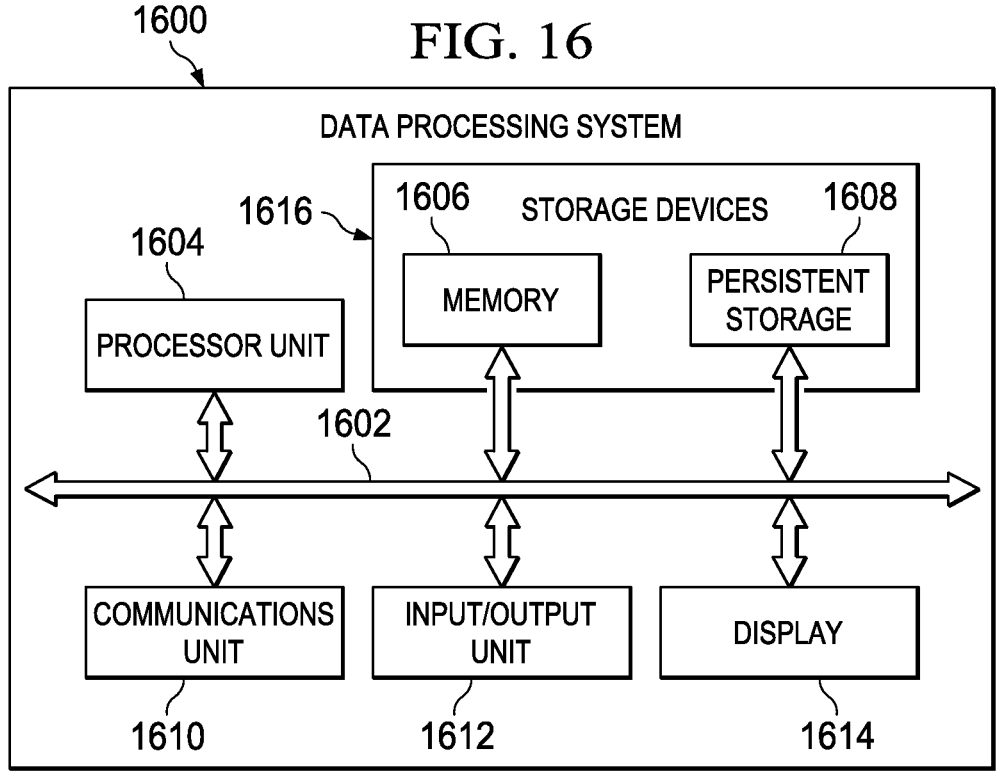
FIG. 16 is an illustration of a block diagram of a data processing system in accordance with an illustrative embodiment.
Figure 16:
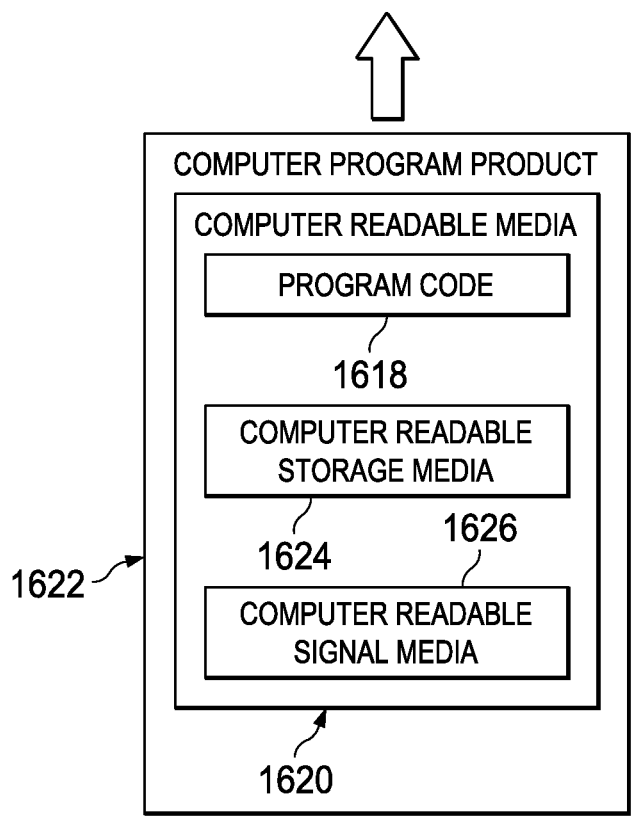

Turning now to FIG. 16, an illustration of a data processing system is depicted in accordance with an illustrative embodiment. Data processing system 1600 may be used to implement analyzer 110 and computer system 112 in FIG. 1. In this illustrative example, data processing system 1600 includes communications framework 1602, which provides communications between processor unit 1604, memory 1606, persistent storage 1608, communications unit 1610, input/output unit 1612, and display 1614. In these examples, communications frame work 1602 may be a bus system.

Processor unit 1604 serves to execute instructions for software that may be loaded into memory 1606. Processor unit 1604 may be a number of processors, a multi-processor core, or some other type of processor, depending on the particular implementation. A number, as used herein with reference to an item, means one or more items. Further, processor unit 1604 may be implemented using a number of heterogeneous processor systems in which a main processor is present with secondary processors on a single chip. As another illustrative example, processor unit 1604 may be a symmetric multi-processor system containing multiple processors of the same type.

Memory 1606 and persistent storage 1608 are examples of storage devices 1616. A storage device is any piece of hardware that is capable of storing information, such as, for example, without limitation, data, program code in functional form, and/or other suitable information either on a temporary basis and/or a permanent basis. Storage devices 1616 may also be referred to as computer readable storage devices in these examples. Memory 1606, in these examples, may be, for example, a random access memory or any other suitable volatile or non-volatile storage device. Persistent storage 1608 may take various forms, depending on the particular implementation.

For example, persistent storage 1608 may contain one or more components or devices. For example, persistent storage 1608 may be a hard drive, a flash memory, a rewritable optical disk, a rewritable magnetic tape, or some combination of the above. The media used by persistent storage 1608 also may be removable. For example, a removable hard drive may be used for persistent storage 1608.

Communications unit 1610, in these examples, provides for communications with other data processing systems or devices. In these examples, communications unit 1610 is a network interface card. Communications unit 1610 may provide communications through the use of either or both physical and wireless communications links.

Input/output unit 1612 allows for input and output of data with other devices that may be connected to data processing system 1600. For example, input/output unit 1612 may provide a connection for user input through a keyboard, a mouse, and/or some other suitable input device. Further, input/output unit 1612 may send output to a printer. Display 1614 provides a mechanism to display information to a user.

Instructions for the operating system, applications, and/or programs may be located in storage devices 1616, which are in communication with processor unit 1604 through communications framework 1602. In these illustrative examples, the instructions are in a functional form on persistent storage 1608. These instructions may be loaded into memory 1606 for execution by processor unit 1604. The processes of the different embodiments may be performed by processor unit 1604 using computer implemented instructions, which may be located in a memory, such as memory 1606.

These instructions are referred to as program code, computer usable program code, or computer readable program code that may be read and executed by a processor in processor unit 1604. The program code in the different embodiments may be embodied on different physical or computer readable storage media, such as memory 1606 or persistent storage 1608.

Program code 1618 is located in a functional form on computer readable media 1620 that is selectively removable and may be loaded onto or transferred to data processing system 1600 for execution by processor unit 1604. Program code 1618 and computer readable media 1620 form computer program product 1622 in these examples. In one example, computer readable media 1620 may be computer readable storage media 1624 or computer readable signal media 1626. Computer readable storage media 1624 may include, for example, an optical or magnetic disk that is inserted or placed into a drive or other device that is part of persistent storage 1608 for transfer onto a storage device, such as a hard drive, that is part of persistent storage 1608. Computer readable storage media 1624 also may take the form of a persistent storage, such as a hard drive, a thumb drive, or a flash memory, that is connected to data processing system 1600. In some instances, computer readable storage media 1624 may not be removable from data processing system 1600. In these examples, computer readable storage media 1624 is a physical or tangible storage device used to store program code 1618 rather than a medium that propagates or transmits program code 1618. Computer readable storage media 1624 is also referred to as a computer readable tangible storage device or a computer readable physical storage device. In other words, computer readable storage media 1624 is a media that can be touched by a person.

Alternatively, program code 1618 may be transferred to data processing system 1600 using computer readable signal media 1626. Computer readable signal media 1626 may be, for example, a propagated data signal containing program code 1618. For example, computer readable signal media 1626 may be an electromagnetic signal, an optical signal, and/or any other suitable type of signal. These signals may be transmitted over communications links, such as wireless communications links, optical fiber cable, coaxial cable, a wire, and/or any other suitable type of communications link. In other words, the communications link and/or the connection may be physical or wireless in the illustrative examples.

In some illustrative embodiments, program code 1618 may be downloaded over a network to persistent storage 1608 from another device or data processing system through computer readable signal media 1626 for use within data processing system 1600. For instance, program code stored in a computer readable storage medium in a server data processing system may be downloaded over a network from the server to data processing system 1600. The data processing system providing program code 1618 may be a server computer, a client computer, or some other device capable of storing and transmitting program code 1618.

The different components illustrated for data processing system 1600 are not meant to provide architectural limitations to the manner in which different embodiments may be implemented. The different illustrative embodiments may be implemented in a data processing system including components in addition to or in place of those illustrated for data processing system 1600. Other components shown in FIG. 16 can be varied from the illustrative examples shown. The different embodiments may be implemented using any hardware device or system capable of running program code. As one example, the data processing system may include organic components integrated with inorganic components and/or may be comprised entirely of organic components excluding a human being. For example, a storage device may be comprised of an organic semiconductor.

In another illustrative example, processor unit 1604 may take the form of a hardware unit that has circuits that are manufactured or configured for a particular use. This type of hardware may perform operations without needing program code to be loaded into a memory from a storage device to be configured to perform the operations.

For example, when processor unit 1604 takes the form of a hardware unit, processor unit 1604 may be a circuit system, an application specific integrated circuit (ASIC), a programmable logic device, or some other suitable type of hardware configured to perform a number of operations. With a programmable logic device, the device is configured to perform the number of operations. The device may be reconfigured at a later time or may be permanently configured to perform the number of operations. Examples of programmable logic devices include, for example, a programmable logic array, a programmable array logic, a field programmable logic array, a field programmable gate array, and other suitable hardware devices. With this type of implementation, program code 1618 may be omitted because the processes for the different embodiments are implemented in a hardware unit.

In still another illustrative example, processor unit 1604 may be implemented using a combination of processors found in computers and hardware units. Processor unit 1604 may have a number of hardware units and a number of processors that are configured to run program code 1618. With this depicted example, some of the processes may be implemented in the number of hardware units, while other processes may be implemented in the number of processors.

In another example, a bus system may be used to implement communications framework 1602 and may be comprised of one or more buses, such as a system bus or an input/output bus. Of course, the bus system may be implemented using any suitable type of architecture that provides for a transfer of data between different components or devices attached to the bus system.

Additionally, a communications unit may include a number of more devices that transmit data, receive data, or transmit and receive data. A communications unit may be, for example, a modem or a network adapter, two network adapters, or some combination thereof. Further, a memory may be, for example, memory 1606, or a cache, such as found in an interface and memory controller hub that may be present in communications framework 1602.

Figure 17:
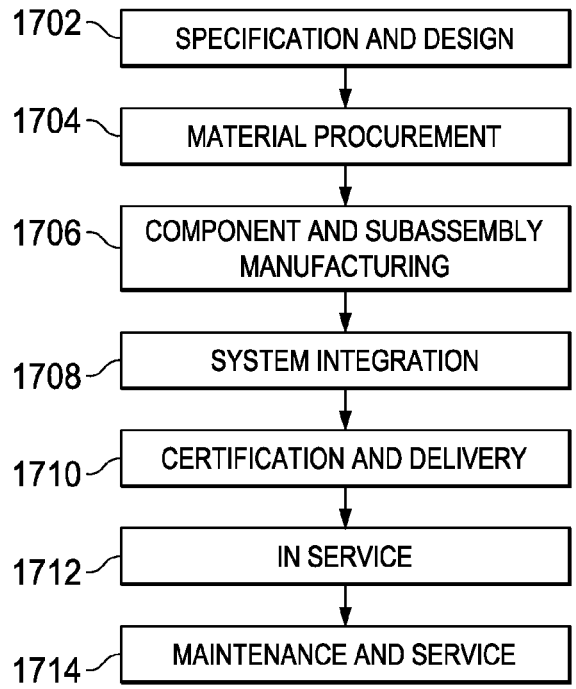
FIG. 17 is an illustration of an aircraft manufacturing and service method in accordance with an illustrative embodiment.
Figure 18:
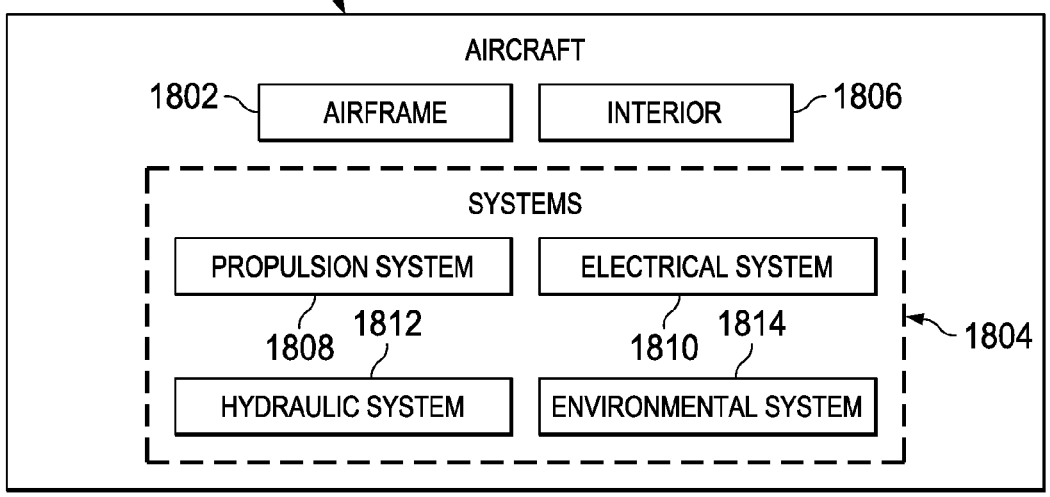
FIG. 18 is an illustration of an aircraft in which an illustrative embodiment may be implemented.

Illustrative embodiments of the disclosure may be described in the context of aircraft manufacturing and service method 1700 as shown in FIG. 17 and aircraft 1800 as shown in FIG. 18. Turning first to FIG. 17, an illustration of an aircraft manufacturing and service method is depicted in accordance with an illustrative embodiment. During pre-production, aircraft manufacturing and service method 1700 may include specification and design 1702 of aircraft 1800 in FIG. 18 and material procurement 1704.

During production, component and subassembly manufacturing 1706 and system integration 1708 of aircraft 1800 in FIG. 18 takes place. Thereafter, aircraft 1800 in FIG. 18 may go through certification and delivery 1710 in order to be placed in service 1712. While in service 1712 by a customer, aircraft 1800 in FIG. 18 is scheduled for routine maintenance and service 1714, which may include modification, reconfiguration, refurbishment, and other maintenance or service.

Each of the processes of aircraft manufacturing and service method 1700 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 18, an illustration of an aircraft is depicted in which an illustrative embodiment may be implemented. In this example, aircraft 1800 is produced by aircraft manufacturing and service method 1700 in FIG. 17 and may include airframe 1802 with plurality of systems 1804 and interior 1806. Examples of systems 1804 include one or more of propulsion system 1808, electrical system 1810, hydraulic system 1812, and environmental system 1814. Any number of other systems may be included. Although an aerospace example is shown, different illustrative embodiments may be applied to other industries, such as the automotive industry.

Apparatuses and methods embodied herein may be employed during at least one of the stages of aircraft manufacturing and service method 1700 in FIG. 17. The illustrative embodiments may be implemented during specification and design 1702 to simulate the potential movement of parts relative to each other in three dimensions using feature patterns. The simulations may be used to alter the design of feature patterns. Additionally, the simulations also may be used to generate instructions for assembly of parts. Also, an identification of tools needed for assembling parts may be identified through the simulations.

With the different simulations, an identification of how much values for parameters may vary from desired values for parameters may be identified. For example, the variation may be selected to increase the ease of assembling parts. As an example, by providing values that are closer to the desired values, the amount of effort and the number of tools needed to assemble the parts may be reduced.

Further, one or more illustrative embodiments may be used during component and subassembly manufacturing 1706 to identify the amount of movement parts may have relative to each other based on the values of features in the manufactured parts. An illustrative embodiment also may be implemented during maintenance and service 1714 to identify the design and manufacture of features and new parts. These different illustrative embodiments may be implemented during maintenance, inspection, refurbishment, and upgrades of aircraft 1800. The use of a number of the different illustrative embodiments may substantially expedite the assembly of and/or reduce the cost of aircraft 1800.

In this manner the complexity of assembly processes for parts may be reduced using an illustrative embodiment. The complexity, difficulty, and cost of assembling parts for a product, such as an aircraft may be reduced with an illustrative embodiment. The information provided about potential movement of parts may be used to reduce the complexity of assembling parts and reducing the cost of manufacturing a complex product, such as an aircraft with tens of thousands or hundreds of thousands of parts that are assembled to manufacture the aircraft.

Further, reductions in the tooling needed to assemble parts may be made using an illustrative embodiment. With reduced tooling, cost savings occur by avoiding costs associating with purchasing and maintaining tools.

The description of the different illustrative embodiments has been presented for purposes of illustration and description, and is not intended to be exhaustive or limited to the embodiments in the form disclosed. Many modifications and variations will be apparent to those of ordinary skill in the art.

Although the illustrative examples for an illustrative embodiment are described with respect to an aircraft, an illustrative embodiment may be applied to other types of platforms. The platform may be, for example, without limitation, a mobile platform, a stationary platform, a land-based structure, an aquatic-based structure, and a space-based structure. More specifically, the platform may be a surface ship, a tank, a personnel carrier, a train, a spacecraft, a space station, a satellite, a submarine, an automobile, a power plant, a bridge, a dam, a house, a manufacturing facility, a building, and other suitable platforms.

Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for identifying a potential movement of a part containing features, the method comprising:
    forming, by a computer system, first lines that are on a plane and extend from a rotation point on the plane to centers of the features in a feature pattern, wherein the first lines extend from the rotation point to the centers of the features;
    forming, by the computer system, second lines that are on the plane, extend from the centers of the features, and are substantially perpendicular to corresponding first lines, wherein the second lines have lengths that are proportional to the corresponding first lines;
    forming, by the computer system, third lines that extend from ends of the second lines and are substantially perpendicular to the plane, wherein each of the third lines have ends opposite the ends of the second lines, and each of the third lines have a same length that determines a scale for forming elongate volumes, where the length is chosen to set the scale for converting a vertical coordinate to a rotation angle;
    forming, by the computer system, elongate volumes that extend from the centers of the features to ends of the third lines; wherein each elongate volume in the elongate volumes has a cross section based on a shape of a corresponding feature in the features;
    performing a translation, by the computer system, of the elongate volumes such that the centers from which the elongate volumes extend have a common center;
    identifying, by the computer system, an intersection of the elongate volumes that is in three dimensions; and
    identifying the potential movement of the part that includes at least one of translation and rotation in three dimensions using the intersection, where a point within the intersection of the elongate volumes provides for rotation and translation of the part; and
    performing a simulation of the amount of potential movement of the part relative to another part in an assembly of parts for aircraft manufacturing, to thereby evaluate the assembly of the part with another part.

2. The method of claim 1 further comprising:
    identifying the rotation point for the features on the plane.

3. The method of claim 1, wherein the part is a first part and wherein identifying the potential movement of the part containing the features using the intersection comprises:
    identifying an amount of the potential movement of the first part in which the features have a number of values for a number of parameters to a second part in which the features have a number of desired values for the number of parameters relative to each other using the intersection.

4. The method of claim 1, wherein a size of the intersection indicates an ease of assembly of parts containing the features.

5. The method of claim 1, wherein the features are holes and the elongate volumes are cylinders.

6. The method of claim 1, wherein the features have a number of sizes.

7. The method of claim 1, wherein the plane defines a surface of a structure in which the features in the feature pattern are located.

8. The method of claim 1, wherein a feature in the features is selected from one of a hole, a slotted hole, and a rectangular slot.

9. The method of claim 1, further comprising:
    translating the elongate volumes such that nominal centers of the features from which the elongate volumes extend have a common center;
    wherein the centers of the features are simulated centers;
    wherein the elongate volumes are formed around fourth lines that extend through the simulated centers of the features and the ends of the third lines;
    wherein the fourth lines extend centrally through the elongate volumes;
    wherein the elongate volumes also extend from the centers of the features in an opposite direction such that the elongate volumes also are on a second side of the plane;
    wherein the elongate volumes extend around the fourth lines on the second side; and
    wherein lengths of the elongate volumes are the same on both a first side and the second side of the plane.

10. A feature analysis system comprising:
    an analyzer in a computer system, wherein the analyzer is configured to
        form first lines on a plane from a rotation point on the plane to centers of features in a feature pattern, wherein the first lines extend from the rotation point to the centers of the features;
        form second lines that are on the plane, extend from the centers of the features, and are substantially perpendicular to corresponding first lines, wherein the second lines have lengths that are proportional to the corresponding first lines;
        form third lines substantially perpendicular to the plane from ends of the second lines, wherein each of the third lines have ends opposite the ends of the second lines, and each of the third lines have a same length that determines a scale for forming elongate volumes, where the length is chosen to set the scale for converting a vertical coordinate to a rotation angle;
        form elongate volumes extending from the centers of the features to ends of the third lines; wherein each elongate volume in the elongate volumes has a cross section based on a shape of a corresponding feature in the features;
        perform a translation of the elongate volumes such that the centers from which the elongate volumes extend have a common center;
        identify an intersection of the elongate volumes that is in three dimensions; and
        identify a potential movement of a part that includes at least one of translation and rotation in three dimensions using the intersection, where a point within the intersection of the elongate volumes provides for rotation and translation of the part; and
        perform a simulation of the amount of potential movement of the part relative to another part in an assembly of parts for aircraft manufacturing, to thereby evaluate the assembly of the part with another part.

11. The feature analysis system of claim 10, wherein the analyzer is configured to identify the rotation point for the features on the plane.

12. The feature analysis system of claim 10, wherein the part is a first part and wherein in being configured to identify the potential movement of the part containing the features using the intersection, the analyzer is
configured to identify an amount of potential movement of the first part in which the features have a number of values for a number of parameters to a second part in which the features have a number of desired values for the number of parameters relative to each other using the intersection.

13. The feature analysis system of claim 10, wherein in being configured to identify the potential movement of the part containing the features using the intersection, the analyzer is configured to perform a simulation of the part containing the features relative to another part containing the features using the intersection.

14. The feature analysis system of claim 10, wherein a size of the intersection indicates an ease of assembly of parts containing the features.

15. The feature analysis system of claim 10, wherein the second lines have lengths that are proportional to the corresponding first lines.

16. A computer program product comprising:
a non-transitory computer readable storage medium;
first program code, stored on the non-transitory computer readable storage medium, for forming first lines on a plane from a rotation point on the plane to centers of features in a feature pattern, wherein the first lines extend from the rotation point to the centers of the features;
second program code, stored on the non-transitory computer readable storage medium, for forming second lines that are on the plane, extend from the centers of the features, and are substantially perpendicular to corresponding first lines, wherein the second lines have lengths that are proportional to the corresponding first lines;
third program code, stored on the non-transitory computer readable storage medium, for forming third lines substantially perpendicular to the plane from ends of the second lines, wherein each of the third lines have ends opposite the ends of the second lines, and each of the third lines have a same length that determines a scale for forming elongate volumes, where the length is chosen to set the scale for converting a vertical coordinate to a rotation angle;
fourth program code, stored on the non-transitory computer readable storage medium, for forming elongate volumes extending from the centers of the features to ends of the third lines; wherein each elongate volume in the elongate volumes has a cross section based on a shape of a corresponding feature in the features;
fifth program code, stored on the non-transitory computer readable storage medium, for performing a translation of the elongate volumes such that the centers from which the elongate volumes extend have a common center, and identifying an intersection of the elongate volumes that is in three dimensions; and
sixth program code, stored on the non-transitory computer readable storage medium, for identifying a potential movement of a part that includes at least one of translation and rotation in three dimensions using the intersection, where a point within the intersection of the elongate volumes provides for rotation and translation of the part;
the sixth program code performing a simulation of the amount of potential movement of the part relative to another part in an assembly of parts for aircraft manufacturing, to thereby evaluate the assembly of the part with another part.

17. The computer program product of claim 16, wherein the part is a first part and wherein the sixth program code comprises:
program code for identifying an amount of potential movement of the first part in which the features have a number of values for a number of parameters to a second part in which the features have a number of desired values for the number of parameters relative to each other using the intersection.

* * * * *